United States Patent
Chien et al.

(10) Patent No.: US 12,557,314 B2
(45) Date of Patent: Feb. 17, 2026

(54) GATE-ALL-AROUND FIELD-EFFECT TRANSISTOR DEVICE

(71) Applicant: Taiwan Semiconductor Manufacturing Co., Ltd., Hsinchu (TW)

(72) Inventors: Wei-Ting Chien, Hsinchu (TW); Liang-Yin Chen, Hsinchu (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 515 days.

(21) Appl. No.: 18/150,596

(22) Filed: Jan. 5, 2023

(65) Prior Publication Data

US 2024/0047553 A1     Feb. 8, 2024

Related U.S. Application Data

(60) Provisional application No. 63/387,996, filed on Dec. 19, 2022, provisional application No. 63/370,330, filed on Aug. 3, 2022.

(51) Int. Cl.
*H10D 30/01* (2025.01)
*H10D 30/43* (2025.01)
*H10D 30/67* (2025.01)
*H10D 62/10* (2025.01)
*H10D 64/01* (2025.01)

(52) U.S. Cl.
CPC .......... *H10D 30/014* (2025.01); *H10D 30/43* (2025.01); *H10D 30/6735* (2025.01); *H10D 62/121* (2025.01); *H10D 64/017* (2025.01)

(58) Field of Classification Search
CPC .. H10D 30/6735; H10D 30/014; H10D 30/43; H10D 64/017; H10D 62/121; H10D 30/6757
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

FOREIGN PATENT DOCUMENTS

| | | |
|---|---|---|
| CN | 112447596 A | 3/2021 |
| TW | 201905987 A | 2/2019 |

*Primary Examiner* — Changhyun Yi
(74) *Attorney, Agent, or Firm* — Slater Matsil, LLP

(57) ABSTRACT

A method of forming a semiconductor device includes: forming semiconductor fin structures over a substrate, where each of the semiconductor fin structures includes a layer stack over a semiconductor fin, the layer stack including alternating layers of a first semiconductor material and a second semiconductor material; forming a capping layer over sidewalls and upper surfaces of the semiconductor fin structures; and forming hybrid fins over isolation regions on opposing sides of the semiconductor fin structures, where forming the hybrid fins includes: forming dielectric fins over the isolation regions; and forming dielectric structures over the dielectric fins, which includes: forming an etch stop layer (ESL) over the dielectric fins; doping the ESL with a dopant; and forming a first dielectric material over the doped ESL.

20 Claims, 19 Drawing Sheets

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,189,714 B2 | 11/2021 | Huang et al. |
| 12,087,844 B2 | 9/2024 | Kao et al. |
| 2021/0057525 A1* | 2/2021 | Chiang ............... H10D 64/01 |
| 2021/0098365 A1* | 4/2021 | Chou ............... H10D 30/797 |
| 2022/0069217 A1* | 3/2022 | Grenouillet ........ H10N 70/8833 |

* cited by examiner

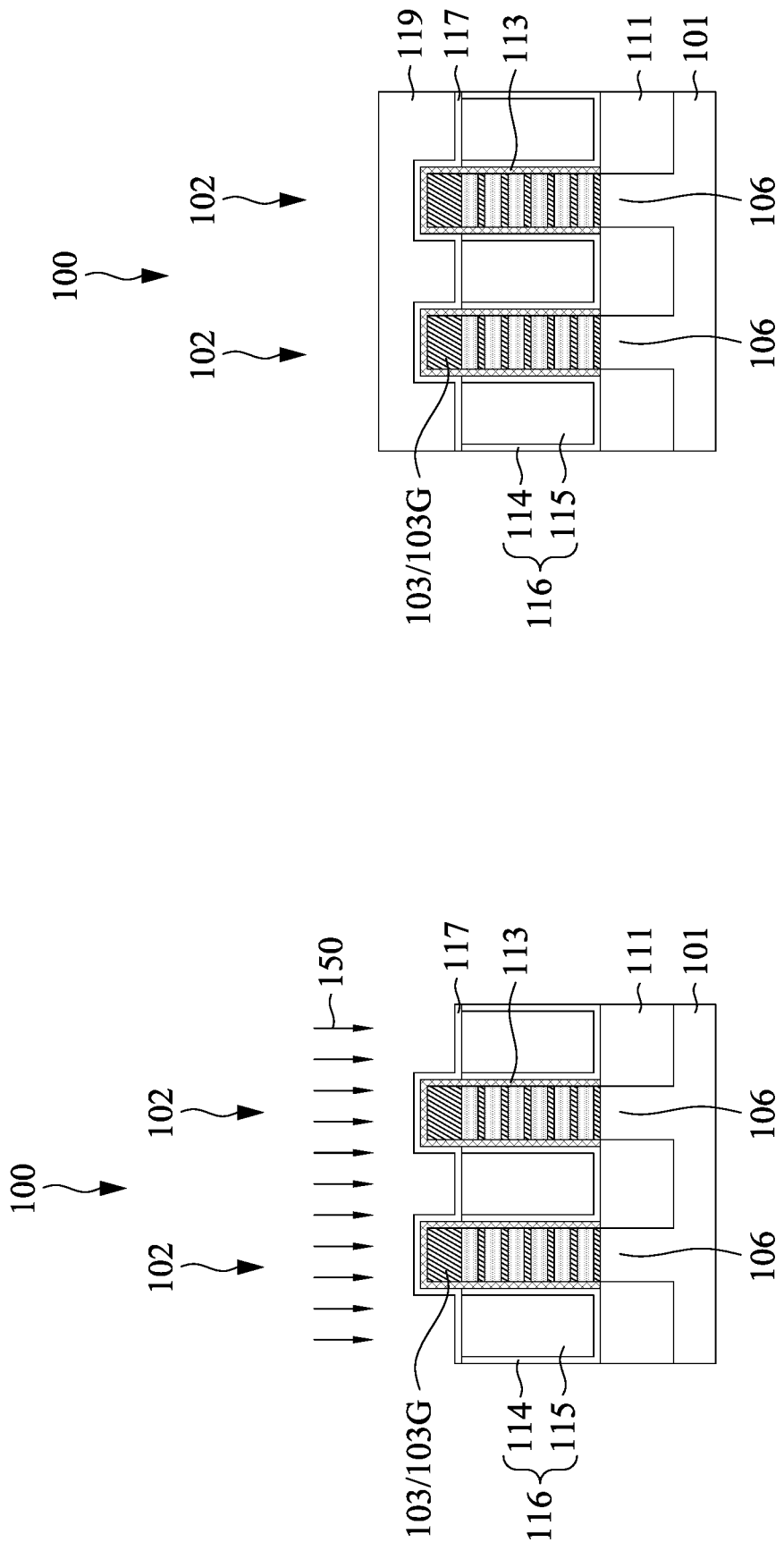

GATE-ALL-AROUND FIELD-EFFECT TRANSISTOR DEVICE

PRIORITY CLAIM AND CROSS-REFERENCE

This application claims priority to U.S. Provisional Patent Application No. 63/370,330, filed Aug. 3, 2022 and U.S. Provisional Patent Application No. 63/387,996, filed Dec. 19, 2022, which applications are hereby incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-3, 4A, 4B, 5-7, 8A, 8B, 9A, 9B, 10-16, 17A, 17B, 18, 19A, 19B, 20A, and 20B are various views of a gate-all-around (GAA) field-effect transistor (FET) device at various stages of manufacturing, in accordance with an embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, hybrid fins comprising dielectric fins and dielectric structures over the dielectric fins are formed over the isolation regions of a gate-all-around (GAA) FET device. The dielectric structures are used to form self-aligned metal gates. In some embodiments, each of the dielectric structures includes a dielectric material and an etch stop layer (ESL) along sidewalls and a bottom of the dielectric material. The ESL is doped by an implantation process to increase the etching selectivity between the dielectric material and the ESL, such that in a subsequent etching processing to recess the dielectric structure, at least a bottom portion of the ESL remains over the underlying dielectric fin to protect layer stacks comprising semiconductor materials used to form nanostructures (e.g., nanosheets, or nanowires) of the GAA FET device.

FIGS. 1-3, 4A, 4B, 5-7, 8A, 8B, 9A, 9B, 10-16, 17A, 17B, 18, 19A, 19B, and 20B are various views (e.g., cross-sectional views, perspective views) of a gate-all-around (GAA) field-effect transistor (FET) device 100 at various stages of manufacturing, in accordance with an embodiment. FIGS. 1-3, 4A, 5-7, 8A, 9A, 17B, 18, 19A, 20A, and 20B are cross-sectional views of the GAA FET device 100, and FIGS. 4B, 8B, 9B, 10-16, 17A, and 19B are perspective view of the GAA FET device 100. Note that for clarity, some of the figures may illustrate only portions of the GAA FET device 100.

Figure 1:
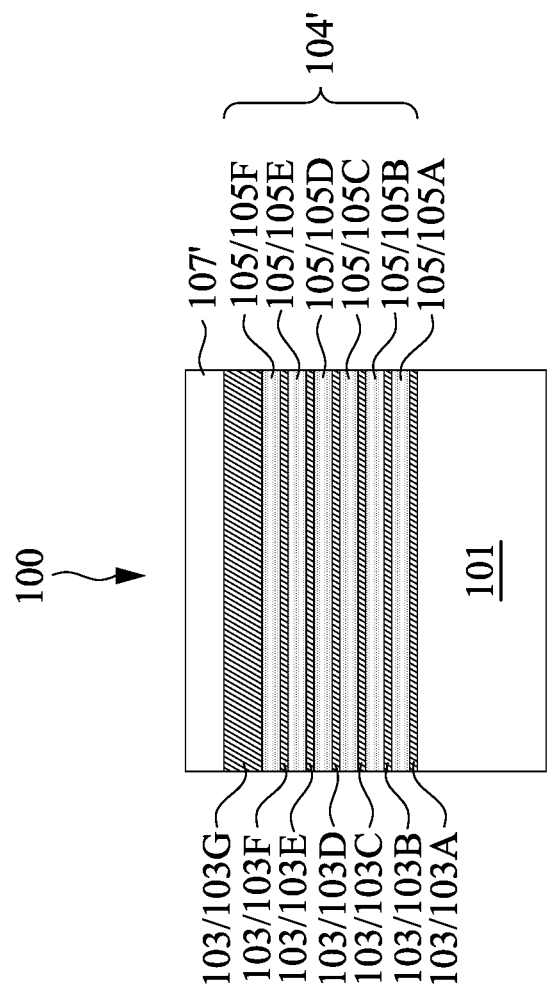

Referring to FIG. 1, a substrate 101 is provided. The substrate 101 may be a semiconductor substrate, such as a bulk semiconductor (e.g., bulk silicon), a semiconductor-on-insulator (SOI) substrate, or the like, which may be doped (e.g., with a P-type or an N-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In FIG. 1, an epitaxial material stack 104' is formed over the substrate 101, and a hard mask layer 107' is formed over the epitaxial material stack 104'. The epitaxial material stack 104' includes first semiconductor layers 103 (labeled as 103A-103G) interleaved with second semiconductor layers 105 (labeled as 105A-105F). The first semiconductor layers 103 are formed of a first semiconductor material, and the second semiconductor layers 105 are formed of a different second semiconductor material. In the illustrated embodiment, the first semiconductor material is silicon germanium ($Si_xGe_{1-x}$, where x can be in the range of 0 to 1), and the second semiconductor material is silicon. The number of layers in the epitaxial material stack 104' in FIG. 1 is merely a non-limiting example, the epitaxial material stacks 104' may include any number of layers. In subsequent processing, the epitaxial material stacks 104' will be patterned to form channel regions of the GAA FET device. In particular, the epitaxial material stacks 104' will be patterned to form horizontal nanostructures (e.g., nanosheets or nanowires), with the channel regions of the resulting GAA FETs including multiple horizontal nanostructures.

The epitaxial material stacks 104' may be formed by an epitaxial growth process, which may be performed in a growth chamber. During the epitaxial growth process, the growth chamber is cyclically exposed to a first set of precursors for growing the first semiconductor layers 103, and then exposed to a second set of precursors for growing the second semiconductor layers 105. The first set of precursors includes precursors for the first semiconductor material (e.g., silicon germanium), and the second set of precursors includes precursors for the second semiconductor material (e.g., silicon). The epitaxial material stacks 104' may be doped or undoped, depending on the design of the GAA FET device.

In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing a first semiconductor layer 103; and (2) disabling the flow of the germanium precursor to the growth chamber when growing a second semiconductor layer 105. The cyclical exposure may be repeated until a target number of layers are formed. After the growth cycles are finished, a planarization process may be performed to level the top surface of the epitaxial material stacks 104'. The planarization process may be a chemical mechanical polish (CMP), an etch back process, combinations thereof, or the like. Note that in the example of FIG. 1, the topmost first semiconductor layer 103G is formed to be thicker than the other first semiconductor layers (e.g., 103A-103F). The thickness of the topmost first semiconductor layers 103G may determine the height of the dielectric structures 118 formed subsequently.

Next, the hard mask layer 107' is formed over the epitaxial material stacks 104'. The hard mask layer 107' may include sublayers, such as a pad oxide layer and an overlying pad nitride layer. The pad oxide layer may be a thin film comprising silicon oxide formed, for example, using a thermal oxidation process. The pad oxide layer may act as an adhesion layer between the epitaxial material stacks 104' and the overlying pad nitride layer. In some embodiments, the pad nitride layer is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

Figure 2:
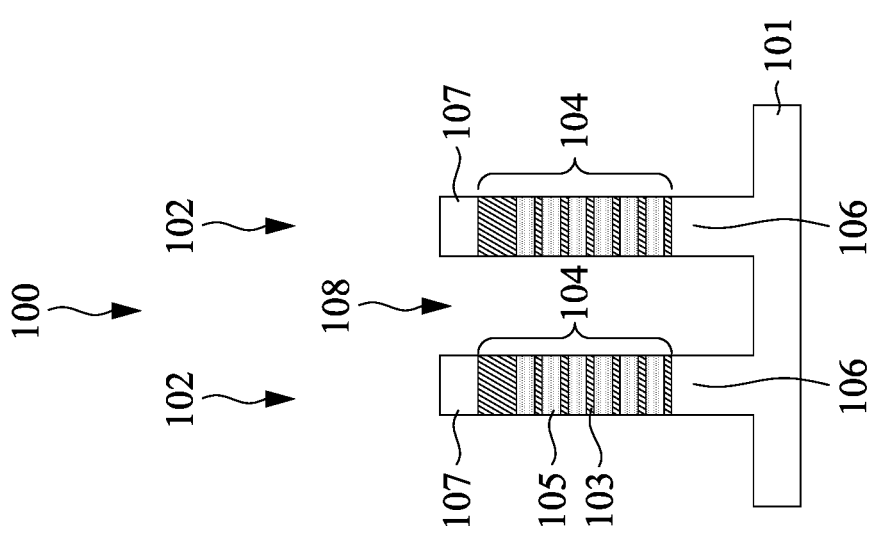

Referring next to FIG. 2, the structure illustrated in FIG. 1 is patterned using, e.g., photolithography and etching techniques to form semiconductor fin structures 102. In some embodiments, the hard mask layer 107' is patterned to form a patterned hard mask 107, and the patterned hard mask 107 is then used as an etching mask to pattern the substrate 101 and the epitaxial material stacks 104'.

To form the semiconductor fin structures 102, the hard mask layer 107' may be patterned using photolithography techniques. Generally, photolithography techniques utilize a photoresist material that is deposited, irradiated (exposed), and developed to remove a portion of the photoresist material. The remaining photoresist material protects the underlying material, such as the hard mask layer 107' in this example, from subsequent processing steps, such as etching. In this example, the photoresist material is used to pattern the hard mask layer 107' to form the patterned hard mask 107, as illustrated in FIG. 2.

The patterned hard mask 107 is subsequently used to pattern the substrate 101 and the epitaxial material stack 104' to form trenches 108, thereby defining semiconductor fin structures 102 between adjacent trenches 108, as illustrated in FIG. 2. In the illustrated embodiment, each of the semiconductor fin structures 102 includes a semiconductor fin 106 (also referred to as a fin 106) and a patterned epitaxial material stack 104 (also referred to as a layer stack 104) over the semiconductor fin 106. The semiconductor fin 106 is a patterned portion of the substrate 101 and protrudes above the (recessed) substrate 101. The patterned epitaxial material stack 104 is a patterned portion of the epitaxial material stack 104' and will be used to form nanostructures (e.g., nanosheets, or nanowires) of the GAA FET device in subsequent processing, and therefore, may also be referred to as GAA structures 104.

In some embodiments, the semiconductor fin structures 102 are formed by etching trenches in the substrate 101 and in the epitaxial material stack 104' using, for example, reactive ion etch (RIE), neutral beam etch (NBE), the like, or a combination thereof. The etching process may be anisotropic. In some embodiments, the trenches 108 may be strips (viewed from in the top) parallel to each other, and closely spaced with respect to each other. In some embodiments, the trenches 108 may be continuous and surround the semiconductor fin structures 102. The semiconductor fin structures 102 may also be referred to as fin structures 102 hereinafter.

The fin structures 102 may be patterned by any suitable method. For example, the fin structures 102 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
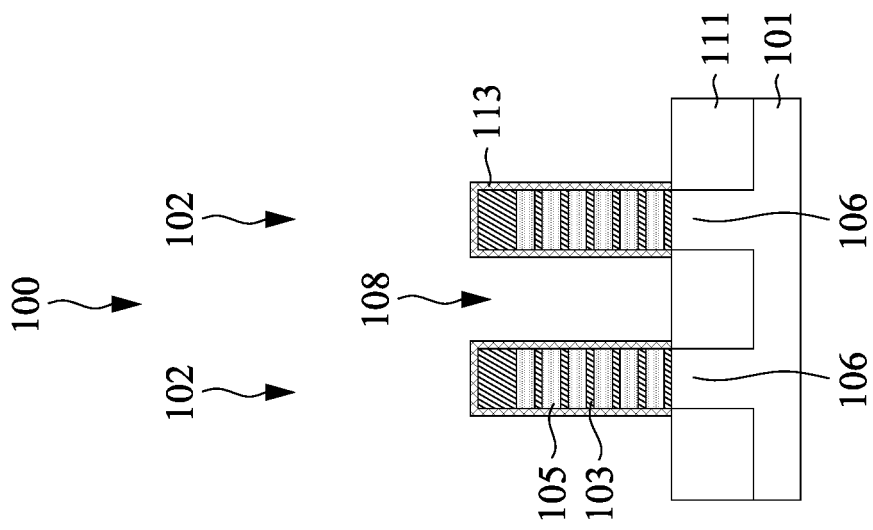

FIG. 3 illustrates the formation of an insulation material between neighboring semiconductor fin structures 102 to form isolation regions 111. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as CMP, may remove any excess insulation material from over the top surfaces of the semiconductor fin structures 102.

Next, the isolation regions are recessed to form shallow trench isolation (STI) regions 111. The isolation regions 111 are recessed such that the upper portions of the semiconductor fin structures 102 protrude from between neighboring STI regions 111. The top surfaces of the STI regions 111 may have a flat surface (as illustrated), a convex surface, a concave surface (such as dishing), or a combination thereof. The top surfaces of the STI regions 111 may be formed flat, convex, and/or concave by an appropriate etch. The isolation regions 111 may be recessed using an acceptable etching process, such as one that is selective to the material of the isolation regions 111. For example, a dry etch, or a wet etch using dilute hydrofluoric (dHF) acid, may be performed to recess the isolation regions 111. In FIG. 3, the upper surface of the STI regions 111 is illustrated to be level with upper surfaces of the semiconductor fins 106. In other embodiments, the upper surface of the STI regions 111 is lower (e.g., closer to the substrate 101) than the upper surfaces of the semiconductor fins 106.

Next, a capping layer 113 is formed over sidewalls and upper surfaces of the fin structures 102 that are exposed by the STI regions 111. In the illustrated embodiment, the capping layer 113 is formed to comprise the same material (e.g., silicon germanium) as the first semiconductor layers 103. In an example embodiment, the capping layer 113 is formed of amorphous silicon germanium, and the first semiconductor layers 103 is formed of epitaxial silicon germanium (e.g., formed by an epitaxy growth process), where a concentration of germanium in the capping layer 113 is between about 10 atomic percentage (at %) and about 30 at %, and a concentration of germanium in the first semiconductor layers 103 is between about 10 at % and about 30 at %. In some embodiments, the capping layer 113 is selectively grown on exposed surfaces of the fin structures 102, and therefore, the upper surfaces of the STI regions 111 are free of the capping layer 113.

Figure 4B:
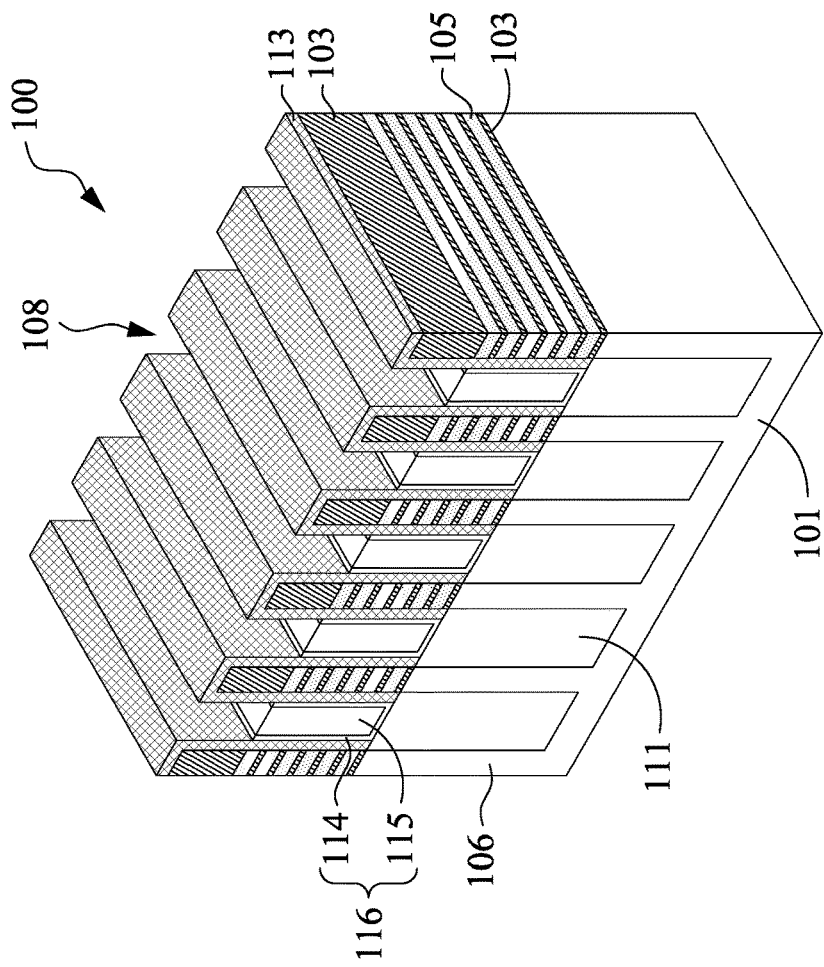
Figure 4A:
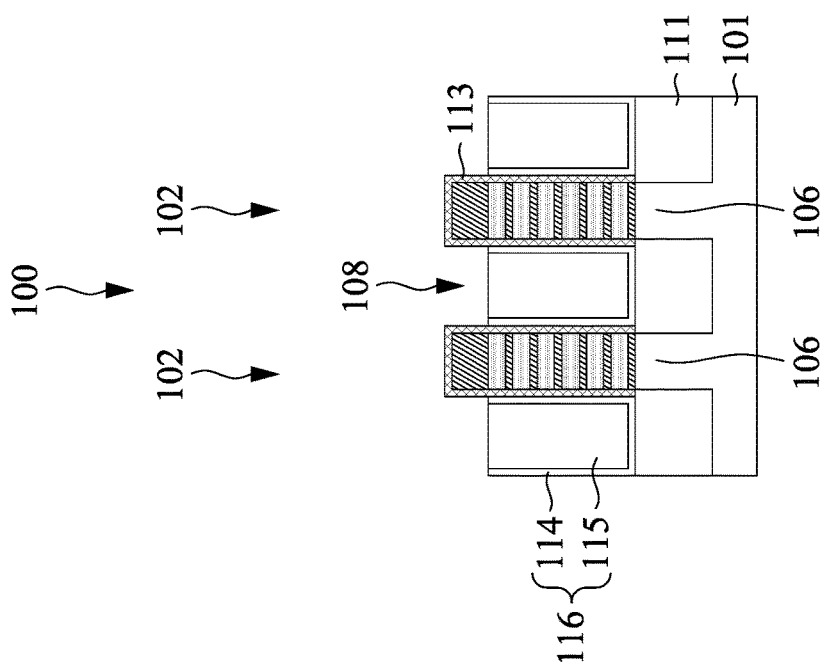

Next, in FIG. 4A, a dielectric layer 114 is conformally formed over the capping layer 113 and over the upper surfaces of the STI regions 111. Next, a dielectric layer 115 is formed over the dielectric layer 114 to fill the trenches 108. The dielectric layer 114 and the dielectric layer 115 are then etched back to form dielectric fins 116, details of which are discussed below.

In some embodiments, the dielectric layer 114 is formed by forming a conformal layer of a dielectric material, such as SiN, SiC, SiCN, or SiOCN, along the capping layer 113 and along the upper surfaces of the STI regions 111 using a suitable deposition method such as CVD, atomic layer deposition (ALD), or the like. The dielectric layer 115 is then formed over the dielectric layer 114. In some embodiments, the dielectric layer 115 is formed of an oxide (e.g., $SiO_2$), which may the same oxide used for forming the STI regions 111. A suitable deposition method, such as CVD, may be used to form the dielectric layer 115. After the dielectric layer 115 is deposited, an additional anneal process may be performed at a temperature between about 400° C. and about 1000° C., for a duration between about 10 seconds and about 3 hours. In some embodiments, the additional anneal process is omitted. In some embodiments, a low-K dielectric material (e.g., having a dielectric constant K smaller than about 7) is used to form the dielectric layer 115.

Next, the dielectric layer 115 is etched back using, e.g., a dry etch process or a wet etch process. For example, a dry etch process using a fluoride-containing gas may be used to etch back the dielectric layer 115. After the dielectric layer 115 is etched back, the dielectric layer 114 exposed by the recessed dielectric layer 115 is removed by a suitable etching process, such as a dry etch process or a wet etch process. For example, a wet etch process using $H_3PO_4$ as etchant may be performed to remove the exposed dielectric layer 114. The remaining portions of the dielectric layer 114 and the remaining portions of the dielectric layer 115 form the dielectric fins 116. In the example of FIG. 4A, the upper surface of the remaining portions of the dielectric layer 114 and the upper surface of the remaining portions of the dielectric layer 115 are level with each other. In some embodiments, both the dielectric layer 114 and the dielectric layer 115 are formed of low-K dielectric materials, therefore, the dielectric fins 116 may also be referred to as low-K dielectric fins. As illustrated in FIG. 4A, the dielectric fins 116 are formed on the STI regions 111, and physically contact the capping layer 113. FIG. 4B illustrates a perspective view of the structure of FIG. 4A.

Next, in FIG. 5, an etch stop layer (ESL) 117 is formed (e.g., conformally) over the dielectric fins 116 and the capping layer 113. The ESL 117 provides etching selectivity with the subsequently formed dielectric material 119. In some embodiments, the ESL 117 is formed of a suitable dielectric material, such as SiN, SiC, SiCN, SiOCN, or BN, using a suitable formation method, such as ALD or CVD, followed by an anneal process (e.g., a furnace process). A thickness of the ESL 117 may be between about 2 nm and about 10 nm, as an example.

Next, the ESL 117 is doped by an implantation process 150. A suitable dopant, such as B, As, Ge, C, Si, Ar, or Xe, is implanted in the ESL 117 by the implantation process 150 to reduce its etch rate and increase its etching selectivity with the subsequently formed dielectric material 119. In some embodiments, the concentration of the dopant in the ESL 117 is between about 2 at % and about 20 at %. The concentration of the dopant in the ESL 117 is tuned to change its etch rate, e.g., a higher dopant concentration may reduce the etch rate of the ESL 117 in a subsequent etching process (see, e.g., FIG. 16). However, if the concentration of the dopant in the ESL 117 is too high (e.g., higher than about 20 at %), the ESL 117 may become electrically conductive. Since the ESL 117 is used to form the dielectric structure 118 (e.g., for electrical isolation), the concentration of the dopant in the ESL 117 is maintained between about 0 at % and about 20 at % to avoid isolation failure of the dielectric structure 118, in some embodiments.

In some embodiments, the implantation process 150 is performed at a temperature between about −100° C. and about 500° C. An energy of the implantation process 150 may be between about 500 electronvolt (eV) and about 5 kiloelectronvolt (KeV). A dosage of the implantation process 150 may be between about 1E15 atoms/cm$^2$ and 1E16 atoms/cm$^2$. A tilt angle of the implantation process 150 may be between about 0 degree and about 60 degrees. The parameters of the implantation process 150 may be tuned to change the etching selectivity of the ESL 117. In some embodiments, the implantation process 150 is tuned to be a directional shallow surface treatment process, such that a concentration of the dopant is the highest at the half thickness (e.g., the middle point along thickness direction) of the ESL 117, and the lower half of the ESL 117 has a gradient decrease in the concentration of the dopant. In other words, the concentration of the dopant decreases continuously (e.g., having a gradient) from the half thickness of the ESL 117 toward a bottom surface of the ESL 117. The directional shallow surface treatment process may advantageously avoid damaging the underlying layer(s) of the ESL 117 or changing the properties of the underlying layer(s) of the ESL 117.

Next, in FIG. 6, a dielectric material 119 is formed over the ESL 117. The dielectric material 119 fills the trenches 108, and may overfill the trenches 108 and cover the upper surface of the ESL 117. In some embodiments, the dielectric material 119 is a metal oxide, such as $Al_2O_3$, $HfO_2$, $Y_2O_3$, $CeO_2$, TbOx, GdOx, or $La_2O_3$, using a suitable deposition method such as ALD, CVD, or the like. After the dielectric material 119 is deposited, an anneal process, which is optional, may be performed at a temperature between about 800° C. and about 1000° C., for a duration between about 10 seconds and about 1 hour. In some embodiments, the dielectric material 119 is formed of a high-K dielectric material (e.g., having a dielectric constant K larger than about 7).

In some embodiments, the etching selectivity between the dielectric material 119 and the ESL 117, calculated as the ratio between the etch rate of the dielectric material 119 and the etch rate of ESL 117, is improved (e.g., increased) by over 4 times, over 5 times, or more, by doping the ESL 117 with the dopant.

Figure 7:
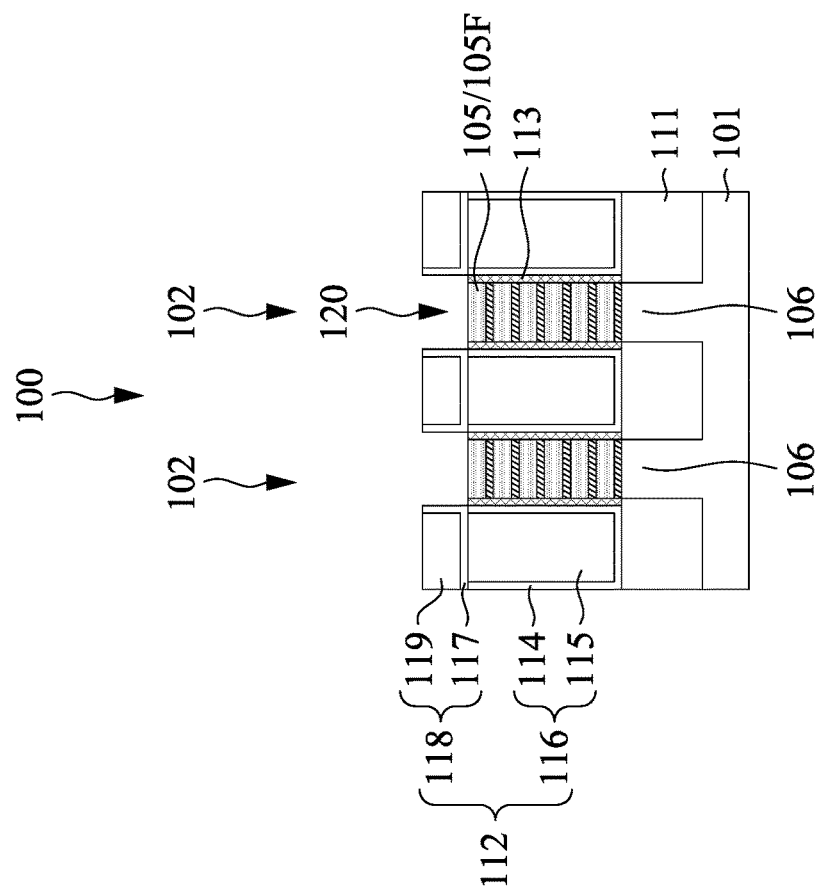

Next, in FIG. 7, a planarization process, such as CMP, is performed to remove portions of the dielectric material 119 and portions of the ESL 117 from the upper surfaces of the fin structures 102. The planarization process may also remove portions of the capping layer 113 from the upper surfaces of the fin structures 102. Next, the topmost first semiconductor layer 103G of the fin structures 102 is removed to form recesses 120 in the dielectric material 119. The topmost first semiconductor layer 103G may be removed by an etching process using an etchant selective to the material (e.g., silicon germanium) of the first semiconductor layer 103. The recesses 120 expose the topmost second dielectric layer 105F of the fin structures 102.

In FIG. 7, the ESL 117 and the dielectric material 119 that are disposed on each dielectric fin 116 form a dielectric structure 118. As illustrated in FIG. 7, the ESL 117 has a U-shaped cross-section, and covers (e.g., contacts and extends along) the sidewalls and the bottom surface of the dielectric material 119 in each dielectric structure 118. The dielectric structures 118 extend further from the substrate 101 than the (recessed) fin structures 102. In the discussion herein, each dielectric fin 116 and a respective overlying dielectric structure 118 are collectively referred to as a hybrid fin 112.

Figure 8A:
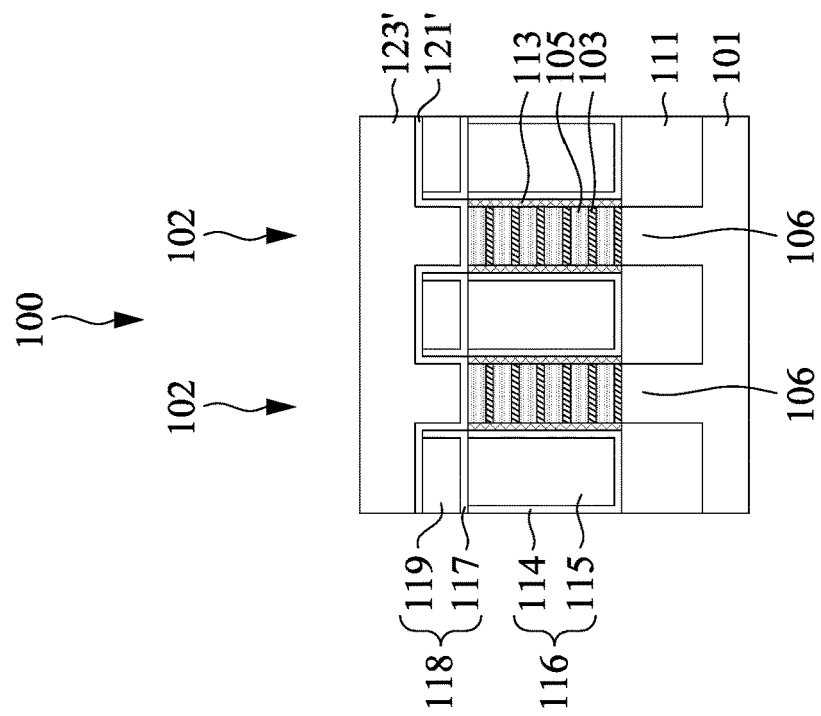
Figure 8B:
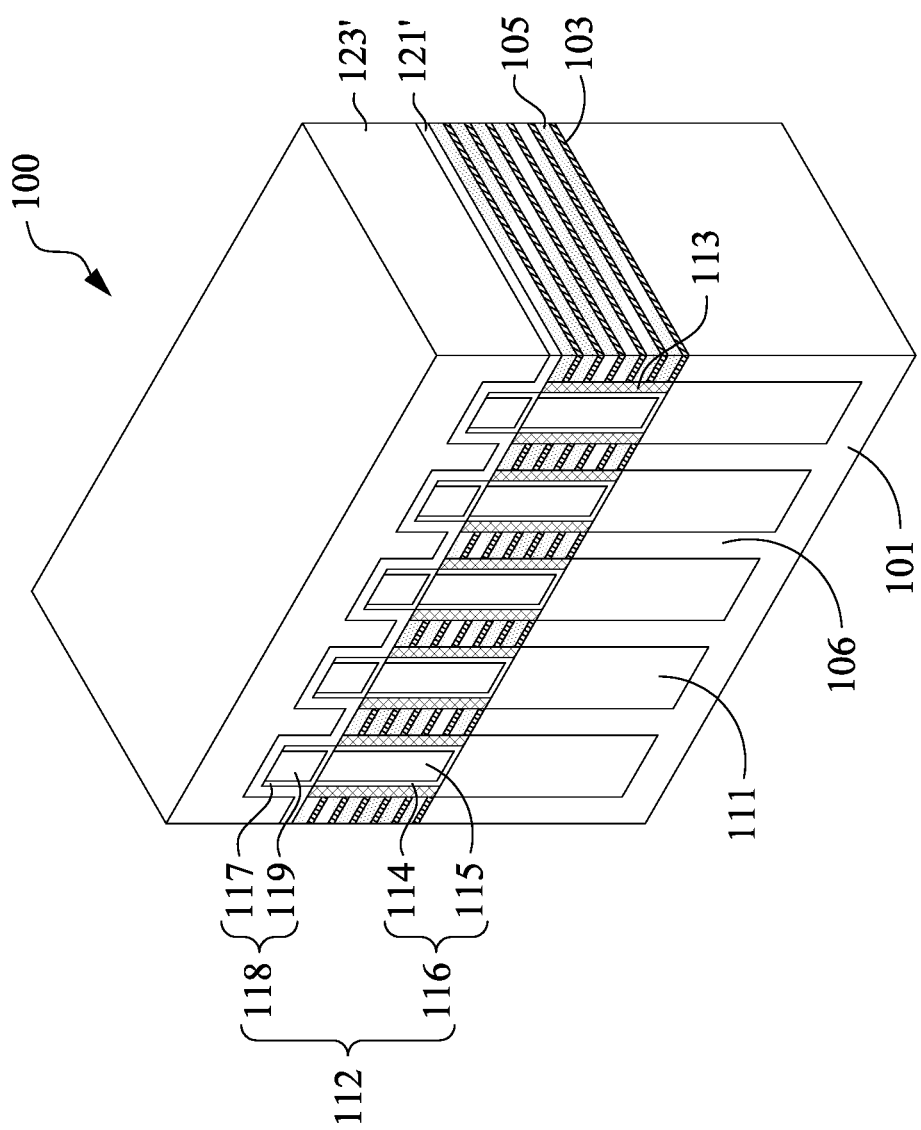

Referring next to FIGS. 8A and 8B, a dummy gate dielectric material 121' is formed (e.g., conformally) over the structure of FIG. 7, and a dummy gate electrode layer 123' is formed over the dummy gate dielectric material 121'. The dummy gate electrode layer 123' fills the recesses 120, and covers the upper surface of the dummy gate dielectric material 121'.

The dummy gate dielectric material 121' may be, for example, silicon oxide, silicon nitride, multilayers thereof, or the like, and may be deposited or thermally grown. The dummy gate electrode layer 123' may be deposited over the dummy gate dielectric material 121' and then planarized, such as by a CMP process. The dummy gate electrode layer 123' may be formed of, for example, polysilicon, although other materials may also be used.

Figure 9B:
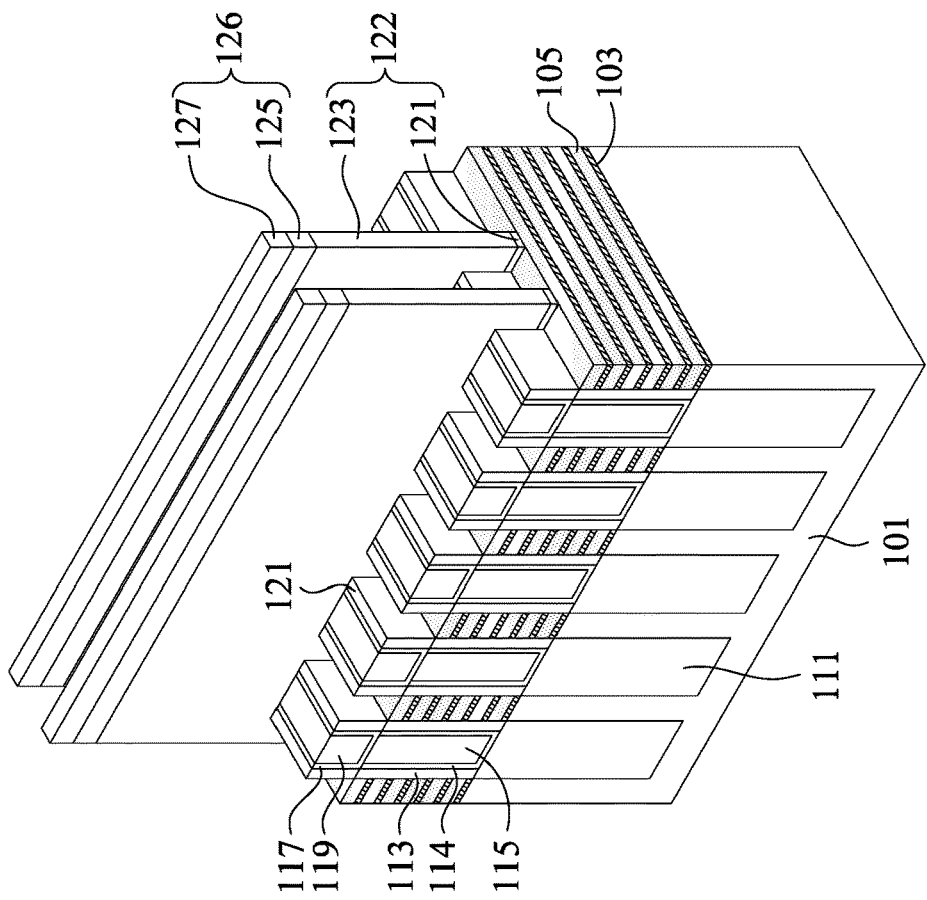
Figure 9A:
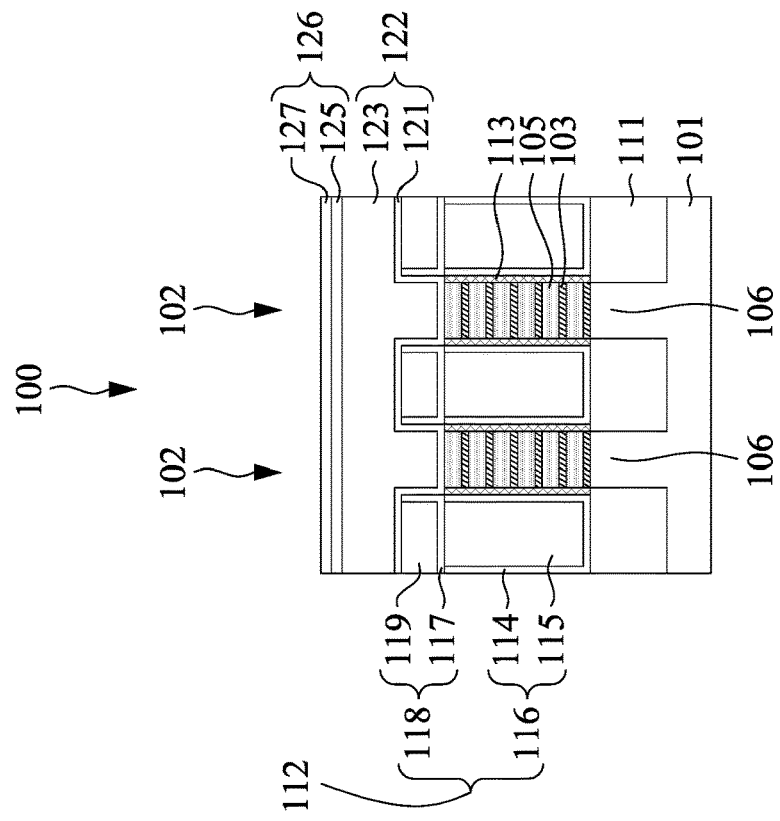

Next, in FIGS. 9A and 9B, dummy gate structures 122 are formed over the semiconductor fin structures 102 and over the hybrid fins 112. Each of the dummy gate structures 122 includes a dummy gate dielectric 121 and a dummy gate electrode 123, in some embodiments.

To form the dummy gate structures 122, a mask layer is deposited over the dummy gate electrode layer 123'. The mask layer may be formed of, for example, silicon oxide, silicon nitride, combinations thereof, or the like. Next, the mask layer is patterned using acceptable photolithography and etching techniques to form masks 126. In the example of FIG. 9A, each of the masks 126 includes a first mask 125 (e.g., silicon oxide) and a second mask 127 (e.g., silicon nitride). The pattern of the mask 126 is then transferred to the dummy gate electrode layer 123' and the dummy gate dielectric material 121' by an acceptable etching technique to form the dummy gate electrode 123 and the dummy gate dielectric 121 of a dummy gate structure 122, respectively. The dummy gate electrode 123 and the dummy gate dielectric 121 are over (e.g., directly over) the respective channel regions of the GAA FET device to be formed. The dummy gate electrode 123 may also have a lengthwise direction substantially perpendicular to the lengthwise direction of the semiconductor fin structures 102 or the lengthwise direction of the hybrid fins 112. Note that the number of dummy gate structures 122 illustrated are for illustration purpose and are not limiting.

Figure 10:
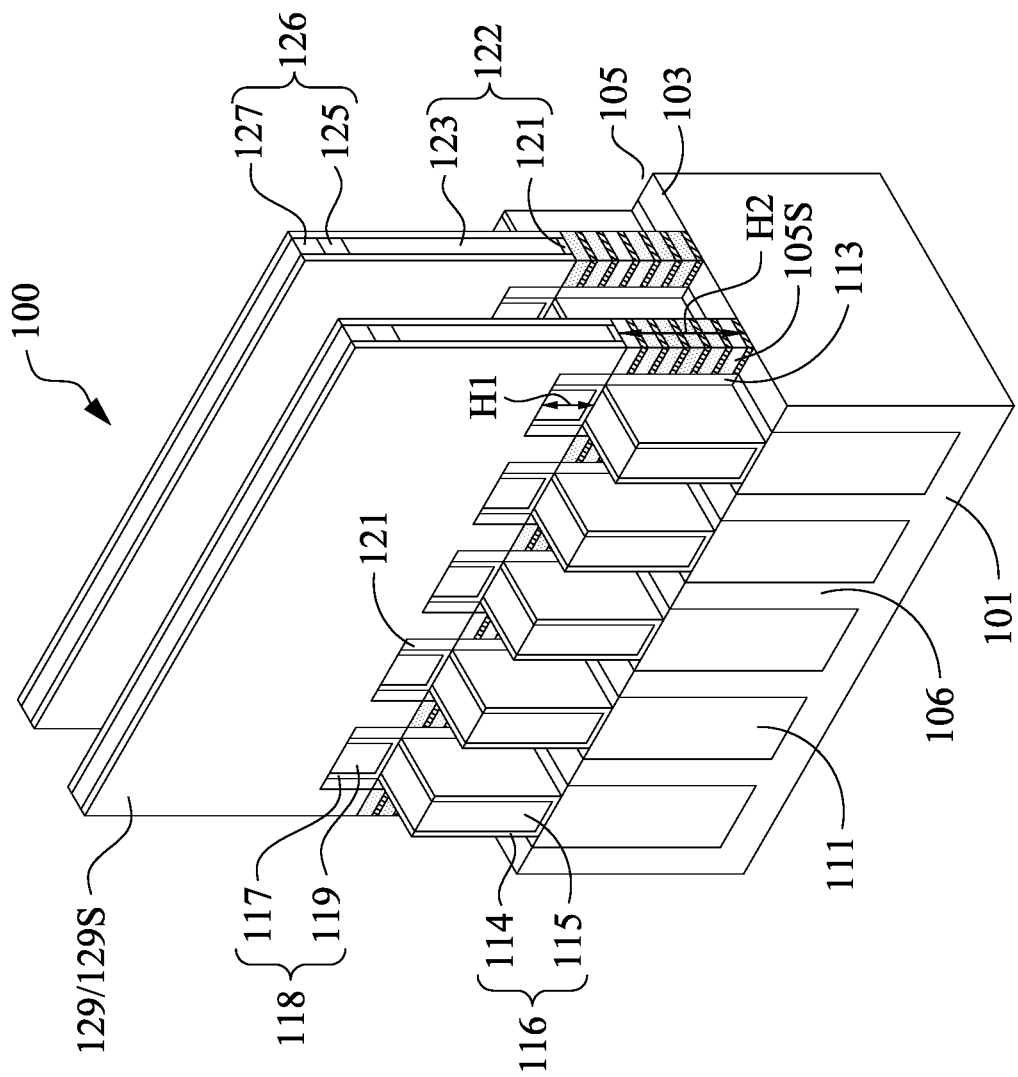

Next, in FIG. 10, gate spacers 129 are formed along opposing sidewalls of the dummy gate structures 122. The gate spacers 129 may be formed by conformally depositing a gate spacer layer over the structure illustrated in FIGS. 9A and 9B. The gate spacer layer may be silicon nitride, silicon carbonitride, a combination thereof, or the like. In some embodiments, the gate spacer layer includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer. The gate spacers 129 are formed by anisotropically etching the gate spacer layer. The anisotropic etching may remove horizontal portions of the gate spacer layer (e.g., over the hybrid fins 112 and the mask 126), with remaining vertical portions of the gate spacer layer (e.g., along sidewalls of the dummy gate electrode 123 and sidewalls of the dummy gate dielectric 121) forming the gate spacers 129.

Next, an anisotropic etching process is performed to remove portions of the dielectric structures 118 and portions of the GAA structures 104 (e.g., 103 and 105) that are disposed outside (e.g., beyond) exterior sidewalls 129S of the gate spacers 129. The anisotropic etching process may be performed using the dummy gate structures 122 and the gate spacers 129 as an etching mask. After the anisotropic etching, the exterior sidewall 129S of each gate spacer 129 is aligned with a respective sidewall 105S of the second semiconductor layer 105, due to the anisotropic etching, in some embodiments.

In some embodiments, the anisotropic etching process is a dry etch process (e.g., a plasma etch process) using an etchant(s) that is selective to (e.g., having a higher etching rate for) the materials of the GAA structure 104. In an example embodiment, the dry etch process has an average etching rate of $E_1$ for the dielectric structure 118 and an average etching rate of $E_2$ ($E_2>E_1$) for the GAA structure 104 (e.g., semiconductor material), and the ratio between $E_1$ and $E_2$ may be chosen to be $E_1/E_2=H_1/H_2$, where $H_1$ is the height of the dielectric structure 118, and $H_2$ is the height of the GAA structure 104 in FIG. 10. With the above relationship between the ratios, when the dielectric structure 118 (e.g., outside the exterior sidewalls of the gate spacers 129) is removed to expose the underlying dielectric fin 116, at the same time, the GAA structure 104 (e.g., outside the exterior sidewalls of the gate spacers 129) are also removed to expose the underlying semiconductor fins 106.

Figure 11:
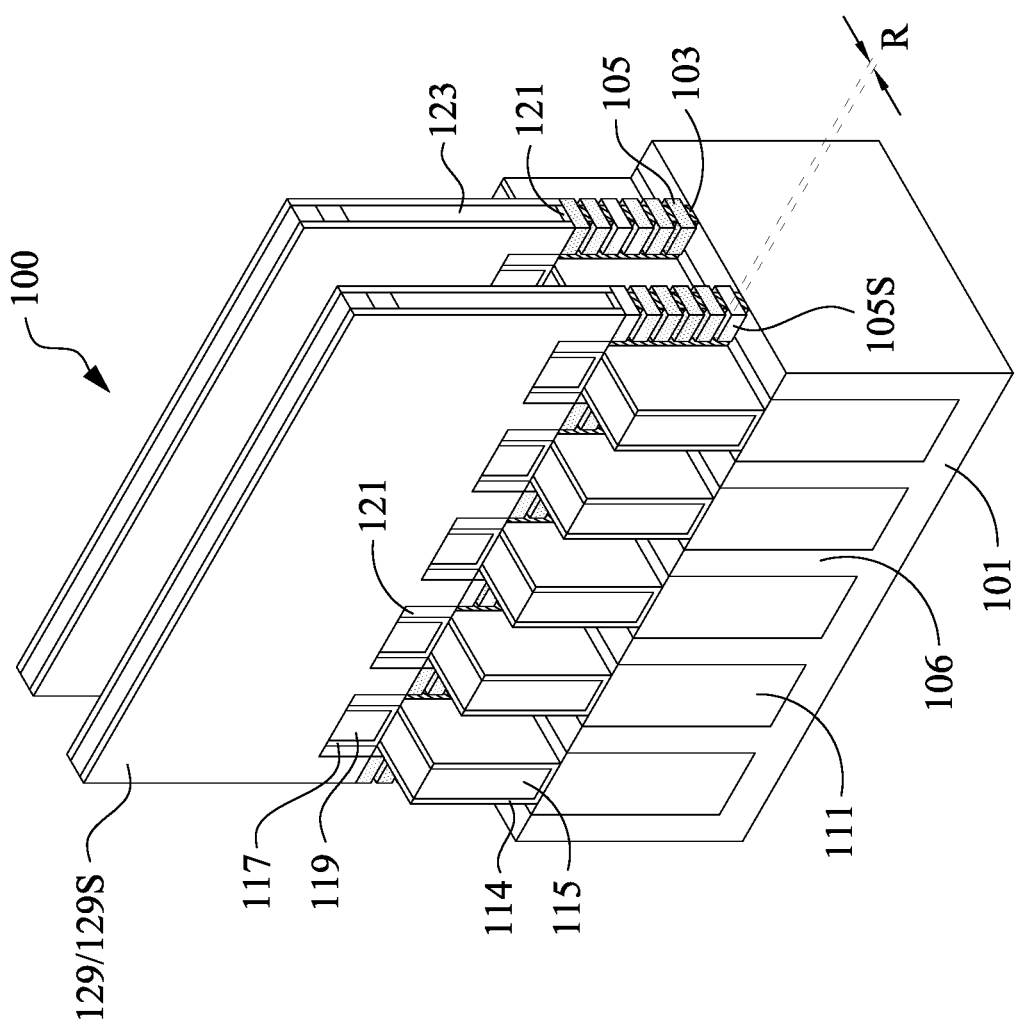

Next, in FIG. 11, a lateral etching process is performed to recess exposed portions of the first semiconductor material using an etchant that is selective to the first semiconductor material. In the example of FIG. 11, both the capping layer 113 and the first semiconductor layer 103 are formed of the first semiconductor material (e.g., SiGe), and therefore, the lateral etch recesses both the capping layer 113 and the first semiconductor layer 103. After the lateral etching process, the first semiconductor material is recessed from the exterior sidewalls 129S of the gate spacers 129, and from the sidewalls 105S of the second semiconductor layer 105. For example, FIG. 11 illustrates an offset R between the sidewall 105S of the second semiconductor layer 105 and the sidewall of the recessed first semiconductor layer 103.

Figure 12:
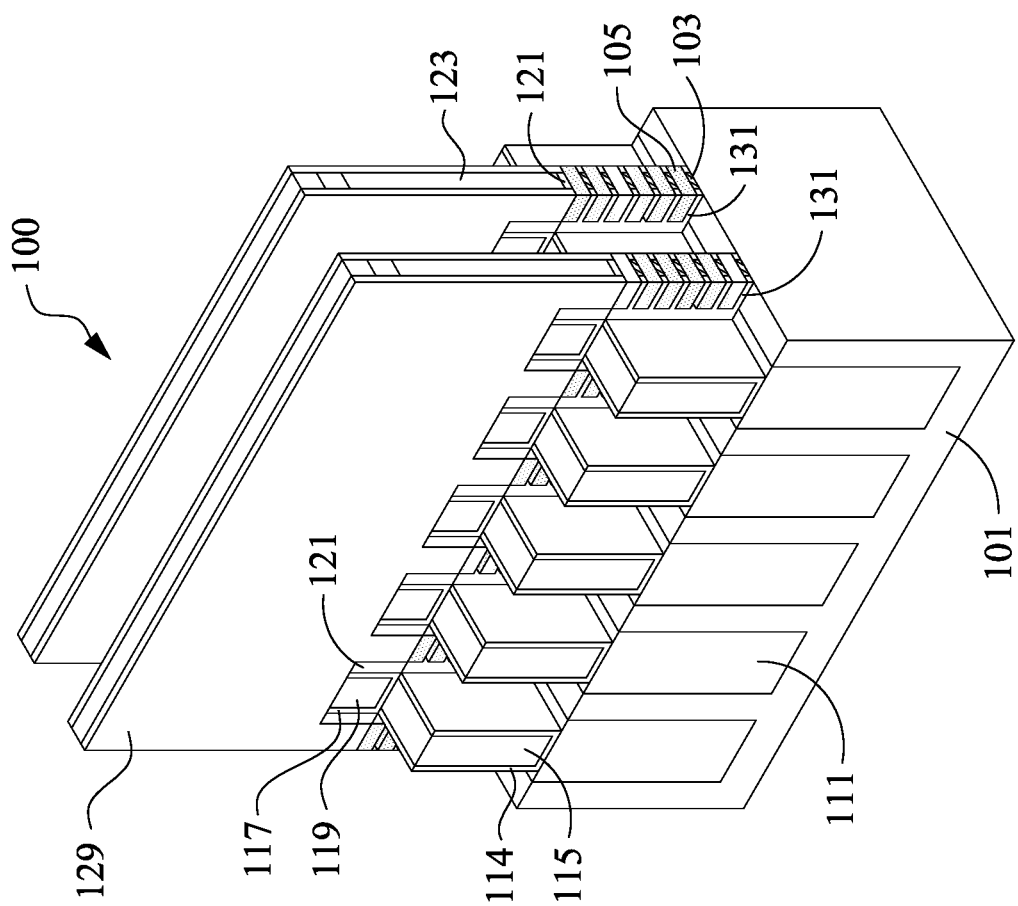

Next, in FIG. 12, a dielectric material 131 is formed to fill the space left by the removal (e.g., recess) of the first semiconductor material discussed above with reference to FIG. 11. The dielectric material 131 may be, e.g., $SiO_2$, SiN, SiCN, or SiOCN, and may be formed by a suitable deposition method, such as ALD. After the deposition of the dielectric material 131, an anisotropic etching process may be performed to trim the deposited dielectric material 131, such that only portions of the deposited dielectric material 131 that fill the space left by the removal of the first semiconductor material are left. After the trimming process, the remaining portions of the deposited dielectric material 131 form inner spacers 131. The inner spacers 131 serve to isolate metal gates from source/drain regions formed in subsequent processing. In the example of FIG. 12, front sidewalls of the inner spacers 131 are aligned with the exterior sidewalls 129S of the gate spacers 129.

Figure 13:
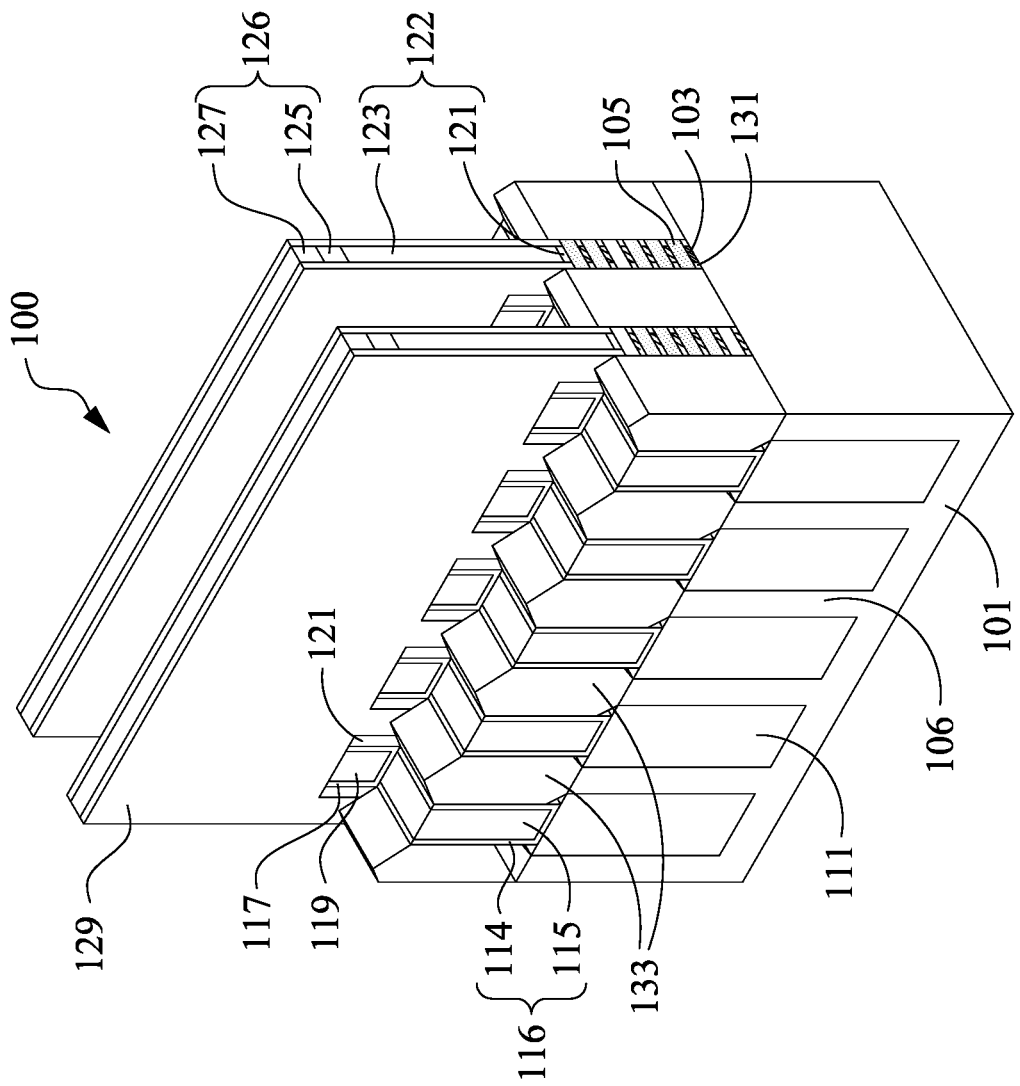

Next, in FIG. 13, source/drain regions 133 are formed over the semiconductor fins 106. In the discussion herein, source/drain region(s) may refer to a source or a drain, individually or collectively dependent upon the context. The source/drain regions 133 are formed by epitaxially growing a material over the semiconductor fins 106, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 13, the epitaxial source/drain regions 133 fill the spaces between adjacent dielectric fins 116. The epitaxial source/drain regions 133 may have surfaces raised from surfaces of the dielectric fins 116 and may have facets. The source/drain regions 133 over adjacent semiconductor fins 106 may merge to form a continuous epitaxial source/drain region 133. In some embodiments, the source/drain regions 133 over adjacent semiconductor fins 106 do not merge together and remain separate source/drain regions 133, as illustrated in FIG. 13. The material(s) of the source/drain regions 133 may be tuned in accordance with the type of devices to be formed. In some embodiments, the resulting GAA FET is an n-type FinFET, and source/drain regions 133 comprise silicon carbide (SiC), silicon phosphorous (SiP), phosphorous-doped silicon carbon (SiCP), or the like. In some embodiments, the resulting GAA FET is a p-type FinFET, and source/drain regions 133 comprise SiGe, and a p-type impurity such as boron or indium.

The epitaxial source/drain regions 133 may be implanted with dopants followed by an anneal process. The implanting process may include forming and patterning masks such as a photoresist to cover the regions of the GAA FET device that are to be protected from the implanting process. The source/drain regions 133 may have an impurity (e.g., dopant) concentration in a range from about $1E19$ $cm^{-3}$ to about $1E21$ $cm^{-3}$. P-type impurities, such as boron or indium, may be implanted in the source/drain region 133 of a P-type transistor. N-type impurities, such as phosphorous or arsenide, may be implanted in the source/drain regions 133 of an N-type transistor. In some embodiments, the epitaxial source/drain regions may be in situ doped during growth.

Figure 14:
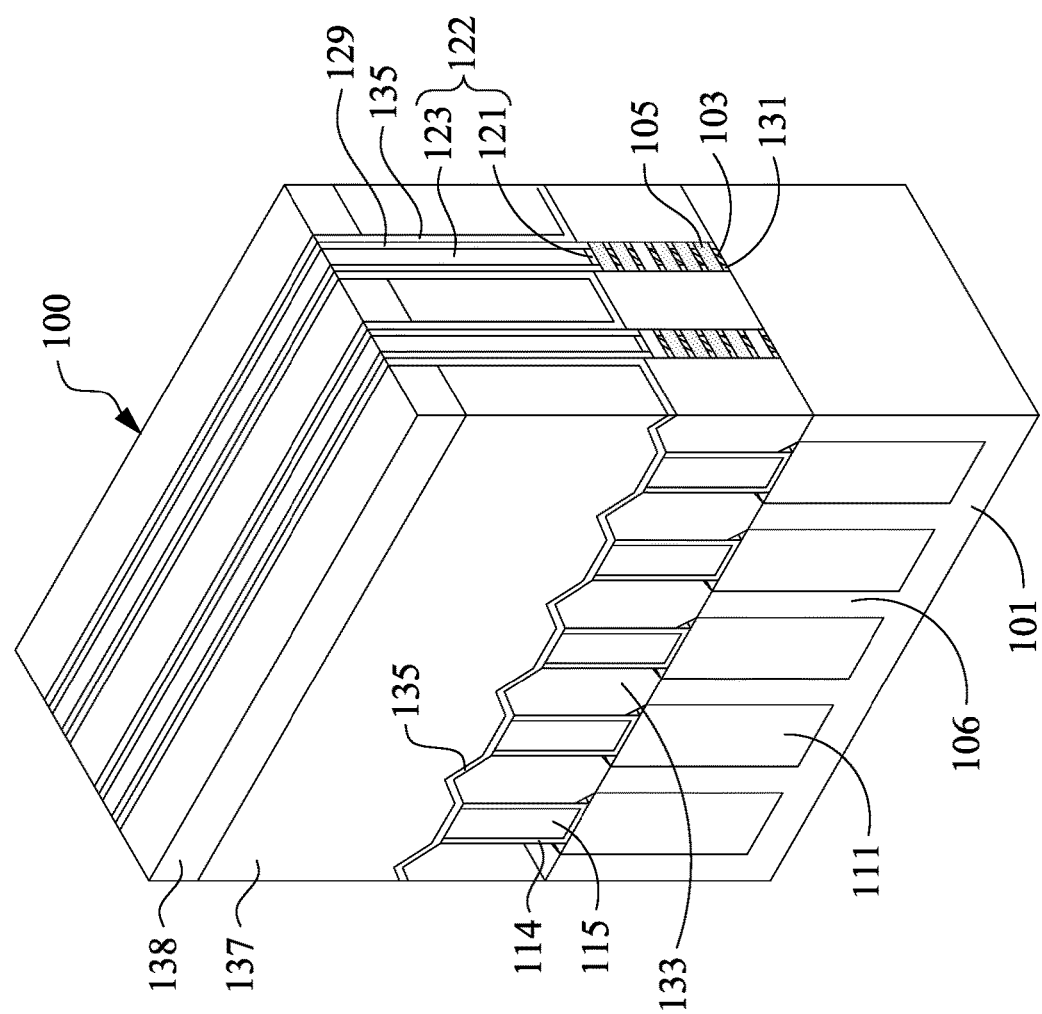

Next, in FIG. 14, a contact etch stop layer (CESL) 135 is formed over the structure illustrated in FIG. 13, and an interlayer dielectric (ILD) layer 137 is formed over the CESL 135. The CESL 135 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

The ILD layer 137 is formed over the CESL 135 and around the dummy gate structures 122. In some embodiments, the ILD layer 137 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. In some embodiments, a dielectric layer 138 is formed over the ILD layer 137. The dielectric layer 138 may comprise a dielectric material (e.g., SiN) having a lower etch rate than the ILD layer 137 to protect the ILD layer 137 from subsequent etching processing. The dielectric layer 138 may be formed by depositing a dielectric material (e.g., SiN) on the ILD layer 137, or may be formed by replacing or converting an upper layer of the ILD layer 137 into the dielectric layer 138. In some embodiments, the dielectric layer 138 is omitted.

Next, a planarization process, such as a CMP process, may be performed to remove the mask 126 (see FIG. 13) and to remove portions of the CESL 135 disposed over the dummy gate electrode 123. After the planarization process, the top surface of the dielectric layer 138 (or the top surface of the ILD layer 137 if the dielectric layer 138 is omitted) is level with the top surface of the dummy gate electrode 123.

Next, the dummy gate structures 122 are removed, nanostructures (e.g., nanosheets, or nanowires) are formed, and replacement gate structures (e.g., metal gate structures) are formed around the nanostructures by performing a replacement gate process. The dielectric structures 118 are used to form self-aligned replacement gate structures. Details are discussed hereinafter.

Figure 15:
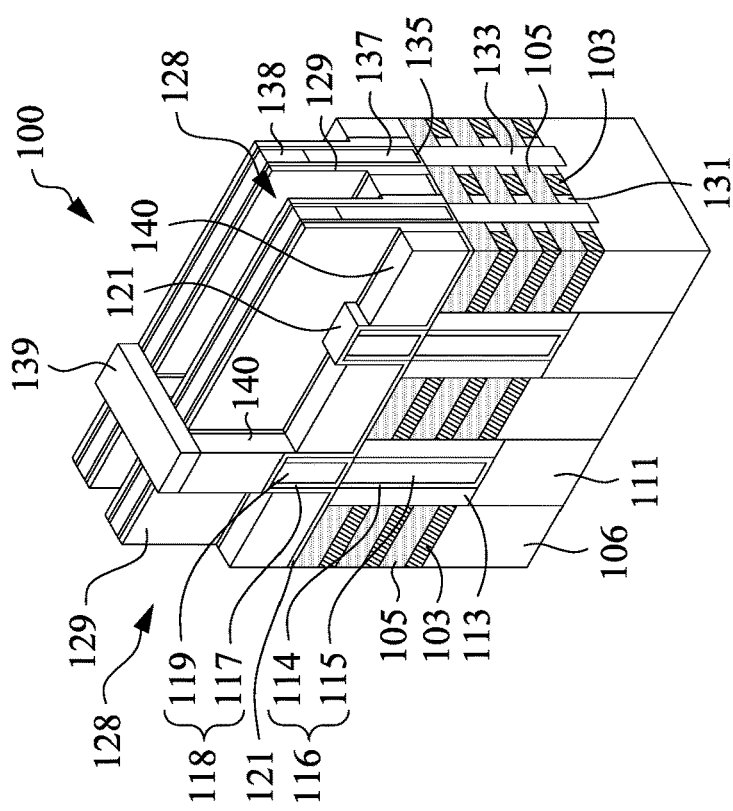

Referring next to FIG. 15, the dummy gate electrodes 123 of the dummy gate structures 122 are removed to form recesses 128 (also referred to as gate trenches 128), where each of the recesses 128 is disposed between the opposing gate spacers 129 along sidewalls of a respective dummy gate structure 122. Note that to facilitate discussion, FIGS. 15, 16, 17A, and 19B illustrate portions of the GAA FET device 100 when viewed from inside a recess 128, e.g., with one of the gate spacers 129 in the front removed.

As illustrated in FIG. 15, after the dummy gate electrode 123 is removed, the dummy gate dielectric 121 is exposed. The dummy gate dielectric 121 extends along the upper surface of the fin structures 102, and along the sidewalls and the upper surfaces of the dielectric structures 118. Next, a patterned mask layer 140 is formed in the recess 128. The patterned mask layer 140 may be formed by depositing a dielectric material (e.g., SiN) in the recesses 128, and patterning the deposited dielectric material with a patterned photoresist layer 139. After the patterned mask layer 140 is formed, the patterned photoresist layer 139 is removed, e.g., by an ashing process. In the example of FIG. 15, the patterned mask layer 140 covers the dielectric structure 118 on the left, and exposes the dielectric structure 118 on the right. In other words, there is an opening in the patterned mask layer 140, and the dielectric structure 118 on the right side of FIG. 15 underlies the opening in the patterned mask layer 140.

Figure 16:
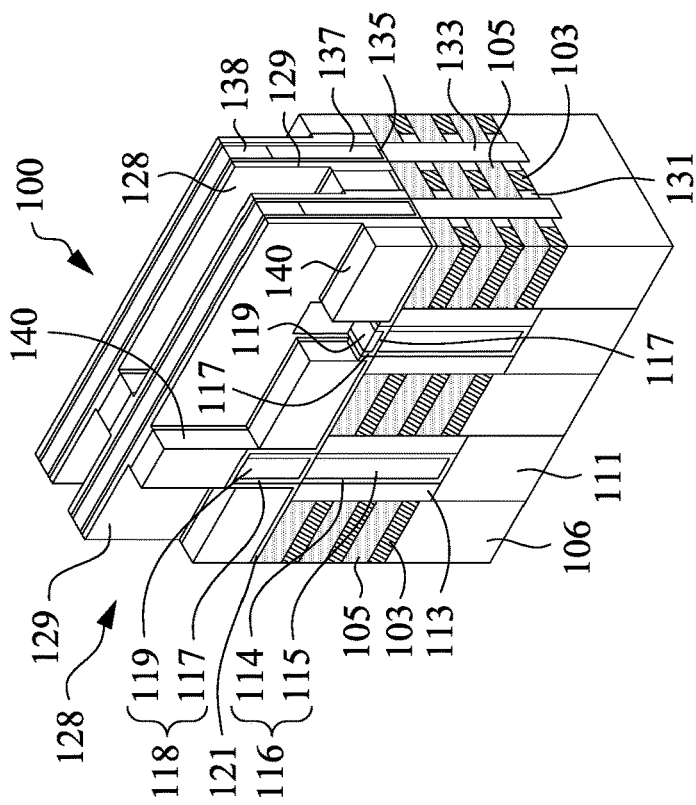

Next, in FIG. 16, a first etching process is performed to recess (e.g., etch) the exposed dielectric structure 118 (e.g., on the right side of FIG. 16). In some embodiments, the first etching process is a plasms dry etch process (e.g., a plasma dry etch process) using a reaction gas comprising $BCl_3$, $Cl_2$, $SiF_4$, $CF_4$, $C_4F_6$, $C_4F_8$, HBr, or a combination thereof. The reaction gas is chosen to have a high etch rate for the dielectric material 119 (e.g., metal oxide), in some embodiments. The first etching process removes portions of the dummy gate dielectric 121 on the exposed dielectric structure 118, and removes upper portions of the exposed dielectric structure 118. Note that due to the doped ESL 117 having a much slow etch rate than the dielectric material 119, after the first etching process, at least a bottom portion of the ESL 117 (e.g., the portion of the ESL 117 extending along the bottom surface of the dielectric material 119) remains. In addition, a bottom portion of the dielectric material 119 of the exposed dielectric structure 118 may also remain, in which case the remaining portion of the ESL 117 also extends along sidewalls of the remaining bottom portion of the dielectric material 119 to form a U-shaped cross-section for the ESL 117, as illustrated in FIG. 16. Note that the dielectric structure 118 on the left side of FIG. 16 is protected from the first etching process by the patterned mask layer 140, and therefore, has a larger height than the remaining portion of the dielectric structure 118 on the right side of FIG. 16.

Figure 17B:
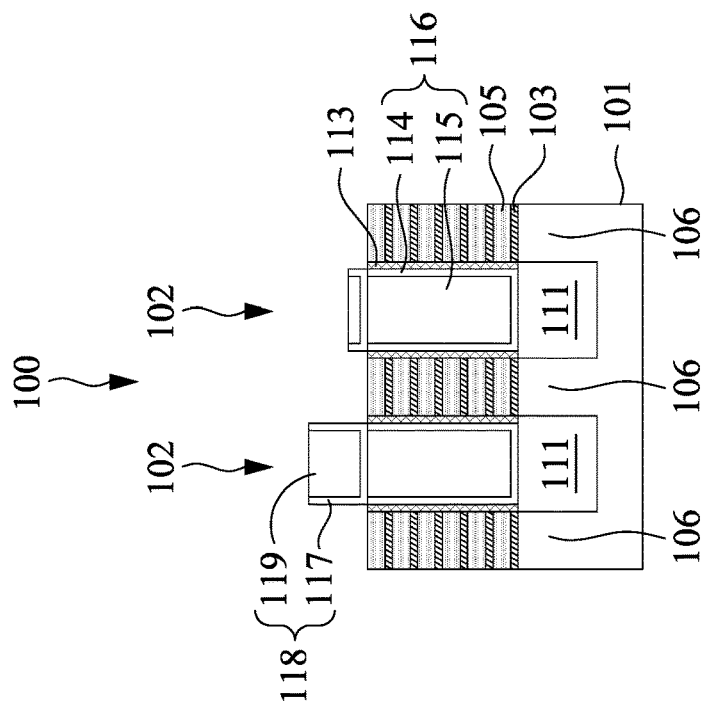
Figure 17A:
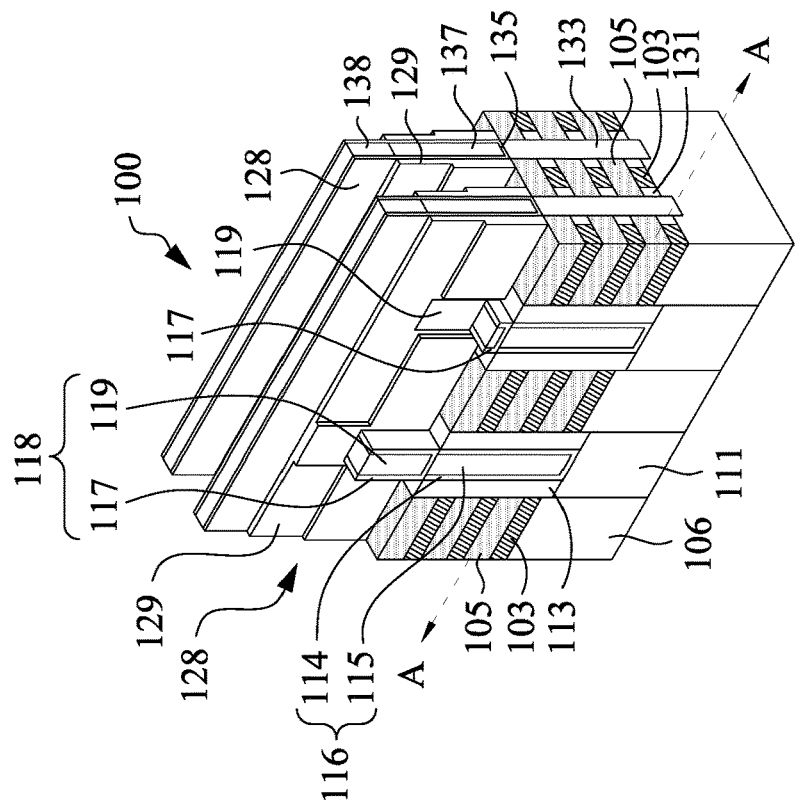

Next, in FIG. 17A, a second etching process, such as a wet etch process, is performed to selectively remove the patterned mask layer 140 and remaining portions of the dummy gate dielectric 121. In the example of FIG. 17A, after the second etching process, both the dielectric structure 118 on the left side and the remaining portions of the dielectric structure 118 on the right side remain on (e.g., cover) their respective underlying dielectric fins 116. In the example of FIG. 17A, the second etching process also removes top portions of the gate spacers 129.

Without the implantation process 150 illustrated in FIG. 5, the (undoped) ESL 117 may not be able to achieve the high etching selectivity of the doped ESL 117. As a result, the first etching process may completely remove the exposed dielectric structure 118, and may further etch through the capping layer 113 into the GAA structure 104, thereby damaging the GAA structures 104. Since the GAA structures 104 are used to form the channel regions (e.g., nanosheets, or nanowires) of the GAA FET device 100, device failure may occur. Therefore, by doping the ESL 117, device failure due to the etch-through (e.g., complete removal) of the exposed dielectric structure 118 is avoided, and production yield is improved.

FIG. 17B illustrates the cross-sectional view of the GAA FET device 100 of FIG. 17A, along cross-section A-A in FIG. 17A. As illustrated in FIG. 17B, after the second etching process, upper surfaces of the capping layer 113 are exposed.

Figure 18:
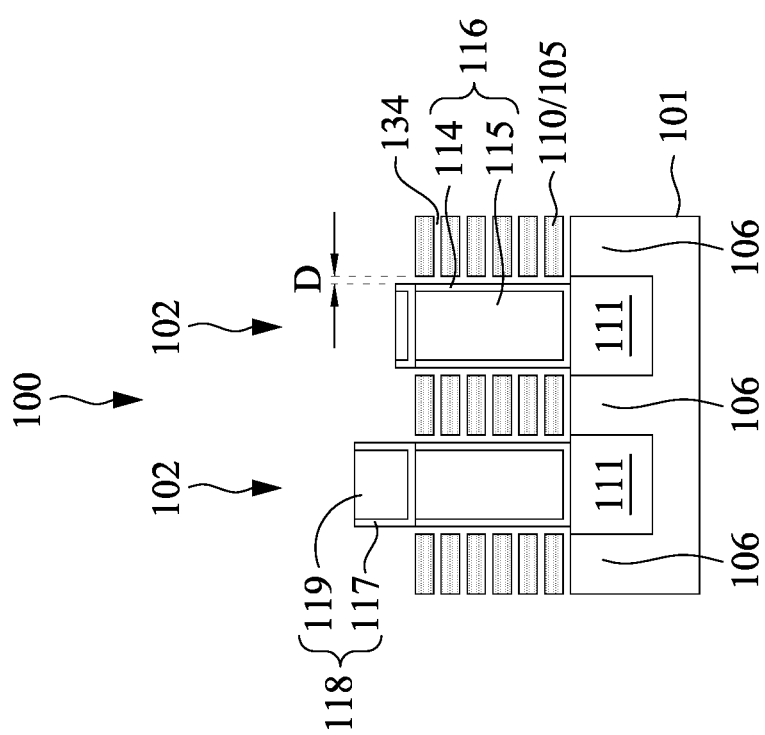

Next, in FIG. 18, the first semiconductor layers 103 and the capping layer 113 are removed to release the second semiconductor layers 105, such that portions of the second semiconductor layers 105 (e.g., portions between the gate spacers 129 and under the recess 128) are suspended. To facilitate discussion herein, the portions of the second semiconductor layers 105 between the gate spacers 129 and under the recess 128 are also referred to as center portions of the second semiconductor layers 105, with the understanding that the center portions of the second semiconductor layers 105 may or may not be at the physical center location of the second semiconductor layers 105. After the first semiconductor layers 103 and the capping layer 113 are removed, the center portions of the second semiconductor layers 105 form a plurality of nano structures 110. Depending on the size and/or aspect ratio of the nanostructures 110, the nanostructures 110 may also be referred to as nanosheets, or nanowires. The nanostructures 110 form the channel regions of the GAA FET device 100.

Since the first semiconductor layers 103 and the capping layer 113 are both formed of the first semiconductor material (e.g., SiGe), a selective etching process, such as a dry etch or a wet etch that is selective to the first semiconductor material may be performed to form the nanostructures 110. The selective etching process to remove the first semiconductor material may also slightly etch the second semiconductor layer 105, which may recess the sidewalls of the second semiconductor layer 105 by, e.g., about 0.5 nm on each side (e.g., left side and right side in FIG. 18), which increases the distance D between the nanostructures 110 and the dielectric fins 116.

Note that the nanostructures 110 are suspended, with empty spaces 134 between adjacent nanostructures 110 and between the dielectric fins 116 and the nanostructures 110. Other portions (may be referred to as end portions) of the second semiconductor layer 105, e.g. portions under the gate spacers 129 and portions beyond the exterior sidewalls of the gate spacers 129, are not released by the selective etching process described above. Instead, the end portions of second semiconductor layer 105 are surrounded by the inner spacer 131, as described below with reference to FIG. 20B.

In some embodiments, the widths of the dielectric fins 116 and the widths of the dielectric structures 118 may be reduced, e.g., using a hybrid fin trimming process to increase the distance D between the nanostructures 110 and the dielectric fins 116. The increased distance D makes it easier to fill the empty spaces 134 with conductive material(s) to form the gate electrodes of the GAA FET device 100, and reduces the electrical resistance of the gate electrodes.

Figures 19A, 19B:
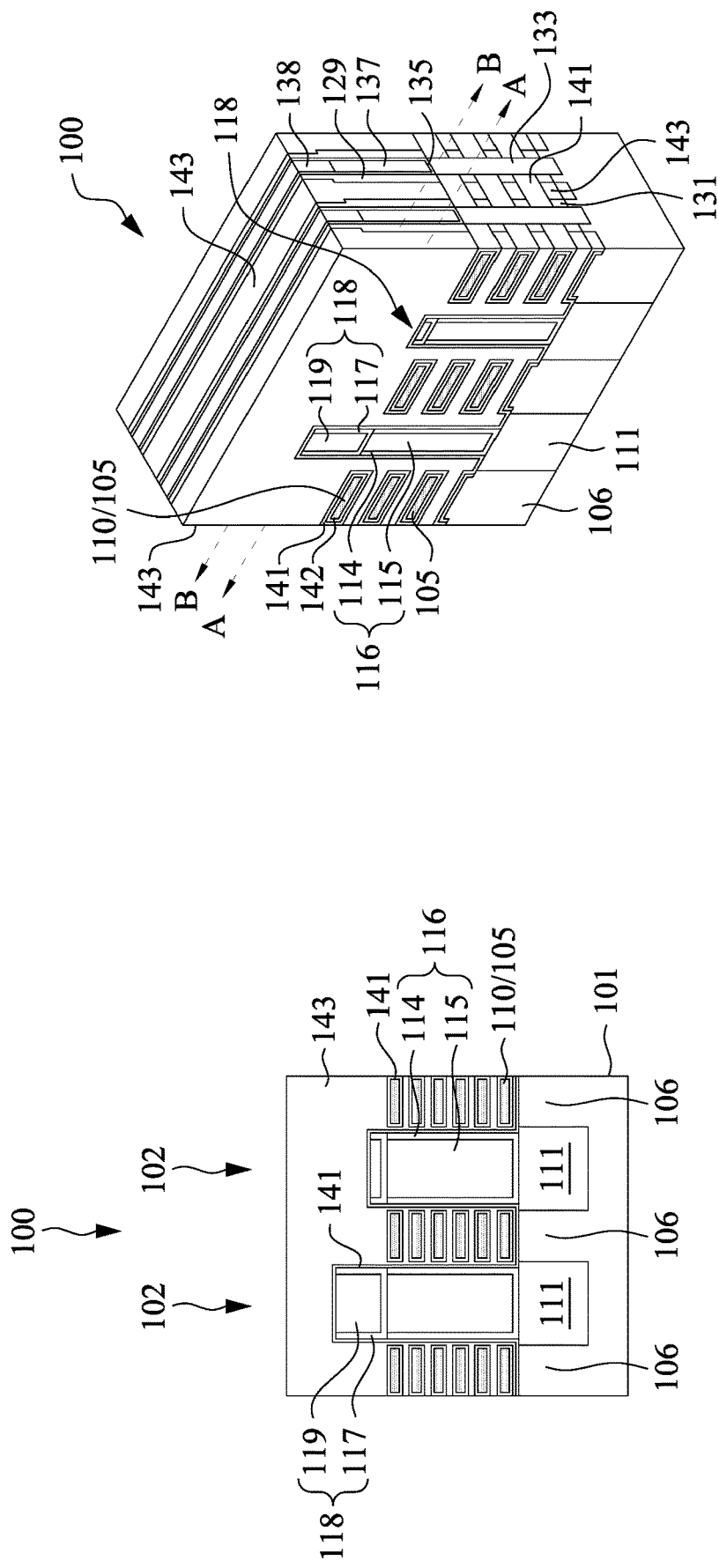

Referring next to FIGS. 19A and 19B, an interface layer 142 (not shown in FIG. 19A but shown in FIG. 19B) is formed over the surfaces of the nanostructures 110. The interface layer 142 is a dielectric layer, such as an oxide, and may be formed by a thermal oxidization process or a deposition process. In the illustrated embodiment, a thermal oxidization process is performed to convert exterior portions of the nanostructures 110 into an oxide to form the interface layer 142, and as a result, the interface layer 142 is not formed over the dielectric fins 116 or the dielectric structures 118.

After the interface layer 142 is formed, a gate dielectric layer 141 is formed around the nanostructures 110, on the dielectric fins 116, and on the dielectric structures 118. The gate dielectric layer 141 may also be formed on the upper surface of the STI regions 111, as illustrated in FIGS. 19A and 19B. In some embodiments, the gate dielectric layer 141 includes a high-k dielectric material (e.g., having a K value greater than about 7.0), and may include a metal oxide or a silicate of Hf, Al, Zr, La, Mg, Ba, Ti, Pb, or combinations thereof. For example, the gate dielectric layers 141 may comprise $HfO_2$, $ZrO_2$, HfAlO, HfSiO, $Al_2O_3$, or combinations thereof. The formation methods of the gate dielectric layer 141 may include molecular beam deposition (MBD), ALD, PECVD, and the like.

In the example of FIGS. 19A and 19B, the portions of the gate dielectric layer 141 around the nanostructures 110 do not merge, and therefore, the subsequently formed gate electrode 143 fills the gaps between, e.g., vertically adjacent nanostructures 110. In some embodiments, portions of the gate dielectric layer 141 formed around the nanostructures 110 merge with adjacent gate dielectric layers 141. As a result, the gate dielectric layer 141 completely fills the gaps between vertically adjacent nanostructures 110, and the gaps between the bottommost nanostructures 110 and the underlying semiconductor fins 106. In some embodiments, the merged gate dielectric layers 141 may prevent over-etching of gate electrode 143 in a subsequent etching process.

Next, an electrical conductive material (may also be referred to as a fill metal) is formed to fill the empty spaces 134 to form gate electrode 143. The gate electrode 143 may be made of a metal-containing material such as Cu, Al, W, the like, combinations thereof, or multi-layers thereof, and may be formed by, e.g., electroplating, electroless plating, or other suitable method. After the gate electrode 143 is formed, a planarization process such as CMP may be performed to planarize the upper surface of the gate electrode 143.

Although not illustrated, barrier layers and work function layers may be formed over the gate dielectric layer 141 and around the nanostructures 110 before the electrical conductive material is formed. The barrier layer may comprise an electrically conductive material such as titanium nitride, although other materials, such as tantalum nitride, titanium, tantalum, or the like, may alternatively be utilized. The barrier layer may be formed using a CVD process, such as PECVD. However, other alternative processes, such as sputtering, metal organic chemical vapor deposition (MOCVD), or ALD, may alternatively be used. After the barrier layer is formed, the work function layer is formed over the barrier layer, in some embodiments.

An N-type work function layer or a P-type work function layer may be formed over the barrier layer and around the nanostructures 110. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, in FIG. 20A, the gate electrode 143 is recessed below the upper surface of the dielectric structure 118 on the left side (e.g., the upper surface of the dielectric material 119). An etching process that is selective to the material (e.g., metal) of the gate electrode 143 may be performed to remove top layers of the gate electrode 143 without substantially attacking the dielectric material 119. In the example of FIG. 20A, after the gate electrode 143 is recessed, the dielectric structure 118 on the left side separates the gate electrode 143 into two separate portions, and therefore, two separate gate structures 145 (e.g., 145A, and 145B) are formed in a self-aligned manner, where each of the gate structures 145 includes the gate dielectric layer 141, the barrier layer, at least one work function layer, and the gate electrode 143.

The self-aligned metal gate formation method disclosed herein provides advantages compared with a reference cut metal gate (CMG) process, where the gate electrode 143 is cut into separate metal gates by forming openings in the gate electrode 143 and filling the opening with a dielectric material. For advanced processing nodes, the reference CMG process may have difficulty filling the openings, due to the high aspect ratio of the openings. Poorly filled openings may cause electrical shorts between the gate structures and may cause device failure. The current disclosure allows for easy separation of the metal gates in a self-aligned manner, thus preventing device failure and improving production yield.

After the gate structures 145A and 145B are formed, an etch stop layer 147 is formed (e.g., selectively formed) over the gate electrode 143. In some embodiments, the etch stop layer 147 is a fluorine-free tungsten (FFW) layer. The etch stop layer 147 (e.g., tungsten) may act as an etch stop layer in a subsequent etching process, and in addition, may help to reduce the electrical resistance of the gate structures 145 and/or gate contact plugs formed thereafter. After the etch stop layer 147 is formed, a dielectric layer 149 is formed over the etch stop layer 147. In some embodiments, a planarization process is performed to planarize the upper surface of the dielectric layer 149.

Figure 20B:
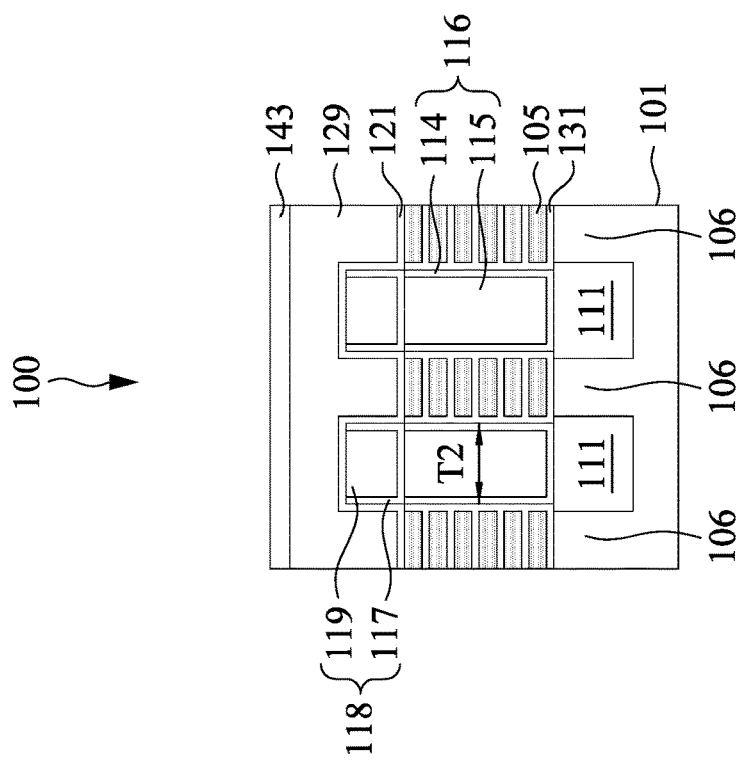
Figure 20A:
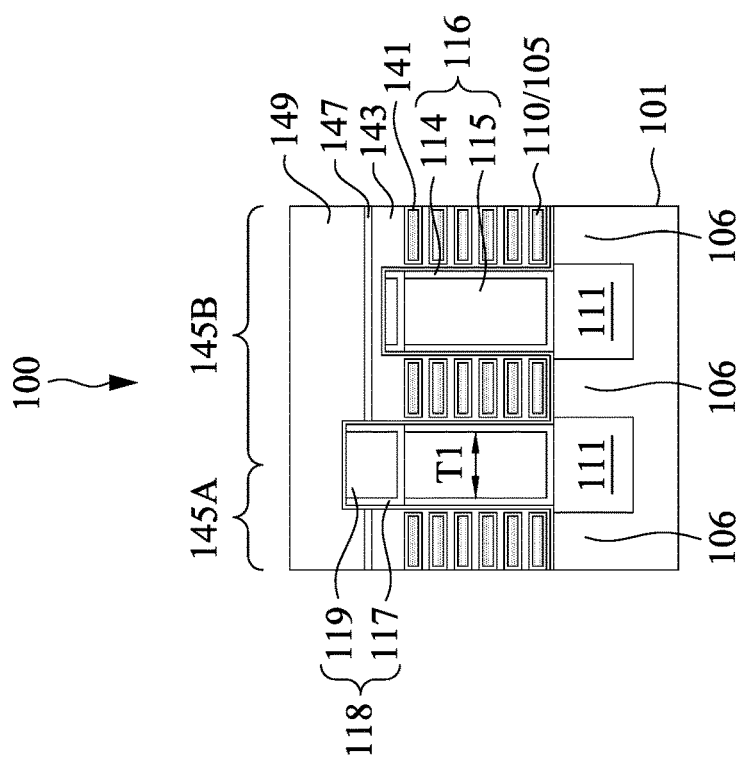

FIG. 20B illustrates a cross-sectional view of the GAA FET device 100 of FIG. 20A, but along cross-section B-B in FIG. 19B. The cross-section B-B cuts vertically inside a gate spacer 129. Note that in the cross-sectional view of FIG. 20B, portions of the second semiconductor layer 105 disposed under (e.g., directly under) the gate spacer 129 are surrounded by the inner spacer 131. In contrast, in FIG. 20A, center portions of the second semiconductor layer 105 (which are the nanostructures 110) under the gate electrode 143 (e.g., between a pair of gate spacers 129) are surrounded by the gate dielectric layer 141 and the interface layer 142. The nanostructures 110 are also at least partially surrounded by the gate electrode 143. In the embodiment of FIG. 20A, the nanostructures 110 are fully surrounded (e.g., in a full circle) by the gate electrode 143.

In addition, the dielectric structures 118 in FIG. 20B have the substantially the same height, since these portions of dielectric structures 118 are not subject to the first etching process of FIG. 16. In contrast, the dielectric structures 118 in FIG. 20A have different heights, as discussed above. Furthermore, in FIG. 20B, the dummy gate dielectric 121 extends along upper surfaces of the fin structures 102, along sidewalls and upper surfaces of the dielectric structures 118. In FIG. 20A, there is no dummy gate dielectric 121 illustrated, due to the second etching process performed in FIG. 17A.

Note that FIG. 20B shows a portion of the gate electrode 143 over the gate spacer 129. Recall that the second etching processing in FIG. 17A removes the upper portions of the gate spacer 129. Therefore, the fill metal for forming the gate electrode 143 may fill the spaces left by the removed upper portions of the gate spacers 129.

In some embodiments, the width of the dielectric fin 116 beyond boundaries of the gate structure 145 (e.g., directly under the gate spacers 129, or under source/drain regions 133) is $T_2$ (see FIG. 20B), which is larger than the width $T_1$ (see FIG. 20A) of the dielectric fin 116 under (e.g., directly under) the gate electrode 143. In some embodiments, the difference between $T_2$ and $T_1$ is between about 2 nm and about 20 nm. The difference between $T_2$ and $T_1$ is due to the hybrid fin trimming process performed, in some embodiments.

The larger width $T_2$ of the dielectric fin 116 under the source/drain region 133 allows for larger error tolerance (or less stringent requirement) for the photolithography and etching process used to form source/drain contacts. For example, if source/drain contacts are shifted (e.g., to the left side or to the right side) due to inaccuracy in the photolithography and etching process to form the contact openings, the larger width $T_2$ of the dielectric fin 116 can tolerate a large amount of shift before electrical short happens between two adjacent source/drain regions 133. As another example, consider the doping (e.g., the implanting process) of the source/drain regions 133 in different regions (e.g., N-type device region and P-type device region) for different types (e.g., N-type, or P-type) of transistors, where a patterned mask may be used to cover the source/drain regions 133 in one region while exposing another region for doping. The larger width $T_2$ allows for larger error margins for the boundary of the mask layer, which boundary may be on the top surface of the dielectric fins 116. In addition, the larger width $T_2$ of the dielectric fin 116 reduces or prevents bridging of adjacent source/drain regions. Furthermore, the larger width $T_2$ of the dielectric fin 116 improve the time dependent dielectric breakdown (TDDB) performance (e.g., from source/drain contact to source/drain region) of the device formed. At the same time, the smaller width $T_1$ (see FIG. 20A) of the dielectric fin 116 under the gate electrode 143 allows for easy fill of the empty spaces 134 by the fill metal, thus improving production yield and reducing the electrical resistance of the gate structures formed.

Additional processing may be performed to form the GAA FET device 100. For example, gate contacts and source/drain contacts may be formed. Interconnect structures may be formed over the gate contacts and source/drain contacts to interconnect the various components formed to form functional circuits. Details are not discussed here.

Figure 21A:
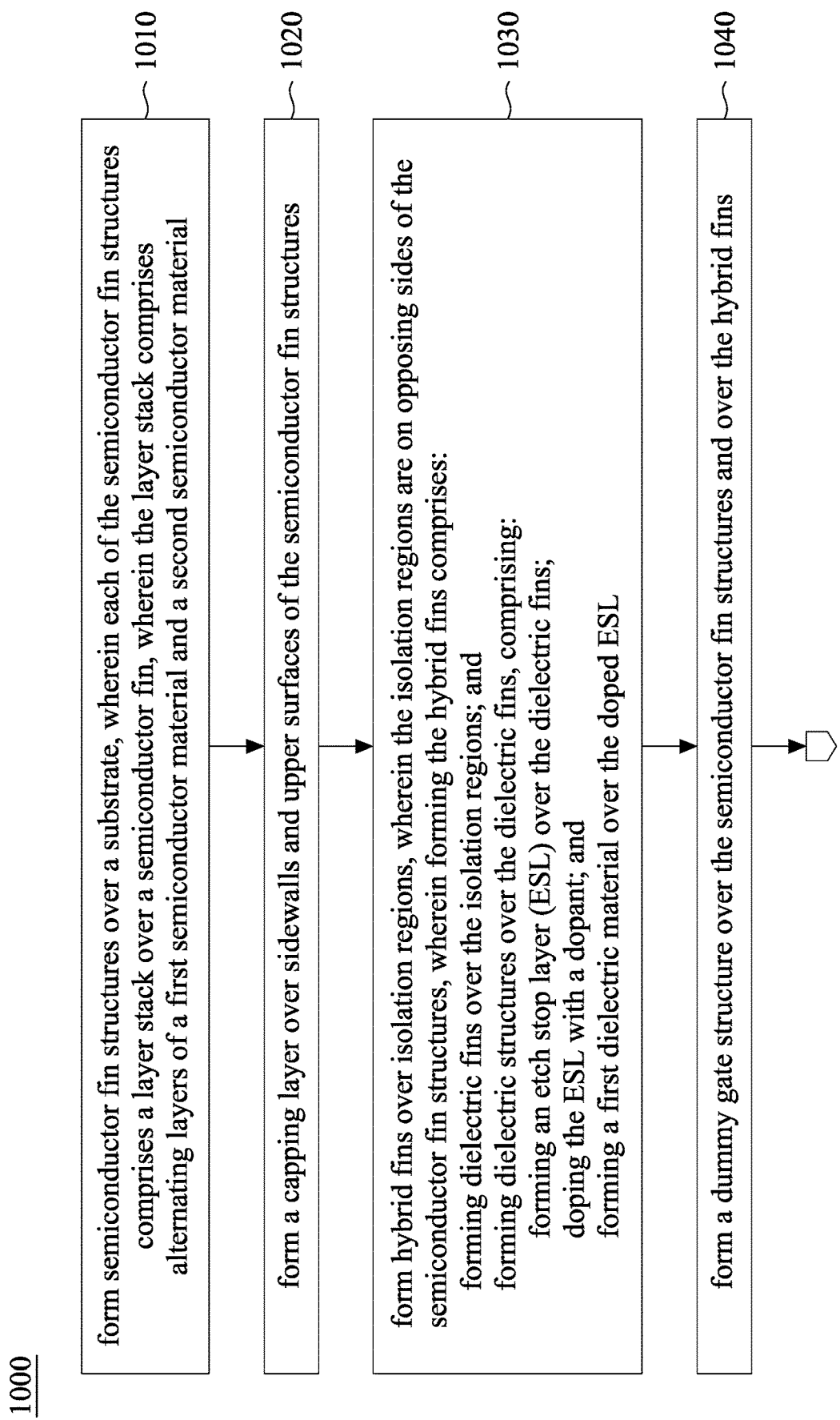
FIGS. 21A and 21B together illustrate a flow chart of a method of forming a GAA FET device, in accordance with some embodiments.
Figure 21B:
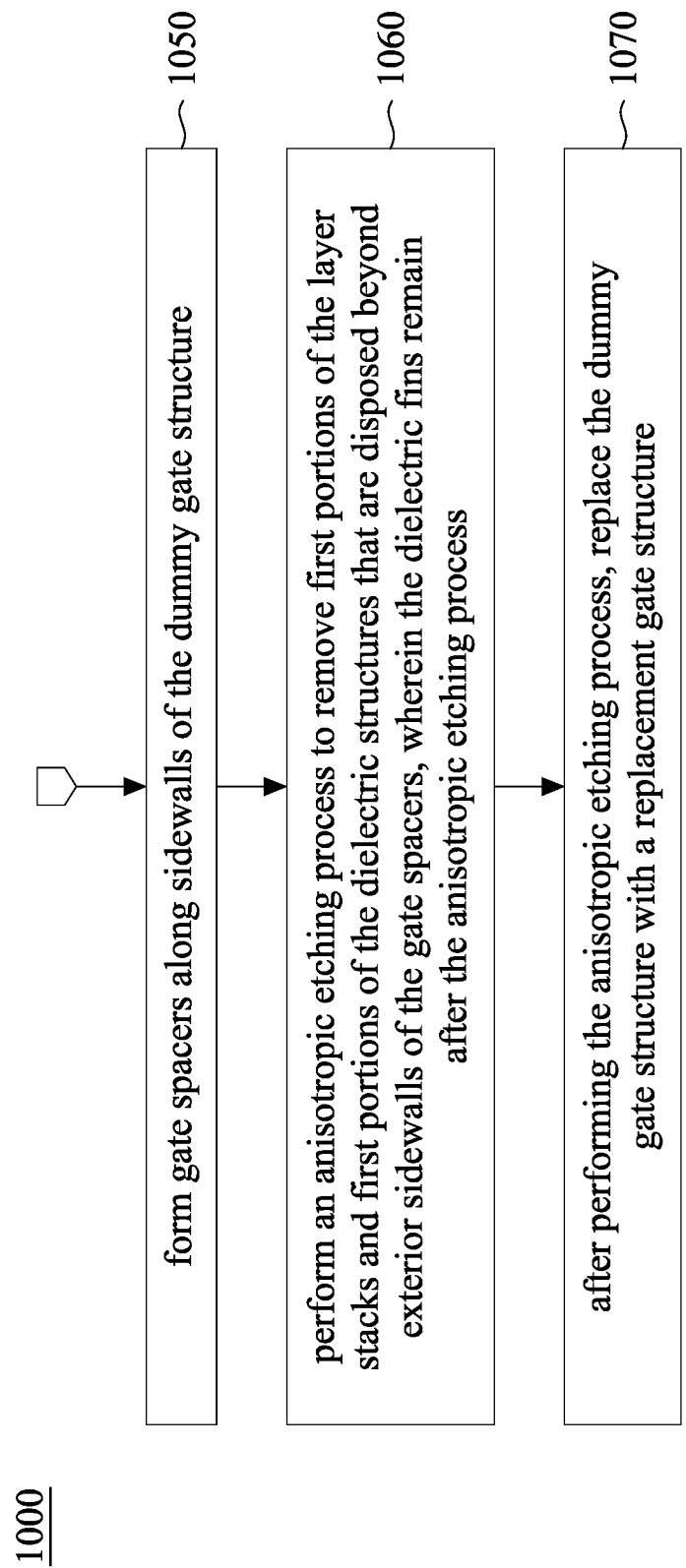

FIGS. 21A and 21B together illustrate a flow chart of a method 1000 of forming a GAA FET device, in accordance with some embodiments. It should be understood that the embodiment method shown in FIGS. 21A and 21B is merely an example of many possible embodiment methods. One of ordinary skill in the art would recognize many variations, alternatives, and modifications. For example, various steps as illustrated in FIGS. 21A and 21B may be added, removed, replaced, rearranged and repeated.

Referring to FIGS. 21A and 21B, at block 1010, semiconductor fin structures are formed over a substrate, wherein each of the semiconductor fin structures comprises a layer stack over a semiconductor fin, wherein the layer stack comprises alternating layers of a first semiconductor material and a second semiconductor material. At block 1020, a capping layer is formed over sidewalls and upper surfaces of the semiconductor fin structures. At block 1030, hybrid fins are formed over isolation regions, wherein the isolation regions are on opposing sides of the semiconductor fin structures, wherein forming the hybrid fins comprises: forming dielectric fins over the isolation regions; and forming dielectric structures over the dielectric fins, comprising: forming an etch stop layer (ESL) over the dielectric fins; doping the ESL with a dopant; and forming a first dielectric material over the doped ESL. At block 1040, a dummy gate structure is formed over the semiconductor fin structures and over the hybrid fins. At block 1050, gate spacers are formed along sidewalls of the dummy gate structure. At block 1060, an anisotropic etching process is performed to remove first portions of the layer stacks and first portions of the dielectric structures that are disposed beyond exterior sidewalls of the gate spacers, wherein the dielectric fins remain after the anisotropic etching process. At block 1070, after performing the anisotropic etching process, the dummy gate structure is replaced with a replacement gate structure.

Embodiments may achieve advantages. For example, due to the doping process to increases the etching selectivity between the dielectric material 119 and the ESL 117, at least the bottom portion of the ESL 117 remains after the first etching process performed to recess the dielectric structure 118. The remaining bottom portion of the ESL 117 protects the underlying dielectric fin 116 and the GAA structure 104 from the first etching process, thereby reducing device failure and increasing production yield. The dielectric fin 116 has a larger width $T_2$ under the source/drain regions 133 and a smaller width $T_1$ under the gate electrode 143. The larger width $T_2$ provides higher error tolerance for the photolithography and etching process to form contact openings and helps to reduce electrical short between adjacent source/drain regions 133. The smaller width $T_1$ makes it easier for the fill metal to fill the recess between gate spacers 129 to form the gate electrode 143, thereby improving production yield and reducing the electrical resistance of the gate electrode. In addition, the dielectric fins 116 improve the time dependent dielectric breakdown (TDDB) performance of the device formed. Furthermore, separation of the different metal gates (e.g., 145A, 145B, 145C) is achieved by the dielectric structures 118 in a self-aligned manner.

In accordance with an embodiment, a method of forming a semiconductor device includes: forming semiconductor fin structures over a substrate, wherein each of the semiconductor fin structures comprises a layer stack over a semiconductor fin, wherein the layer stack comprises alternating layers of a first semiconductor material and a second semiconductor material; forming a capping layer over sidewalls and upper surfaces of the semiconductor fin structures; forming hybrid fins over isolation regions, wherein the isolation regions are on opposing sides of the semiconductor fin structures, wherein forming the hybrid fins comprises: forming dielectric fins over the isolation regions; and forming dielectric structures over the dielectric fins, comprising: forming an etch stop layer (ESL) over the dielectric fins; doping the ESL with a dopant; and forming a first dielectric material over the doped ESL; forming a dummy gate structure over the semiconductor fin structures and over the hybrid fins; forming gate spacers along sidewalls of the dummy gate structure; performing an anisotropic etching process to remove first portions of the layer stacks and first portions of the dielectric structures that are disposed beyond exterior sidewalls of the gate spacers, wherein the dielectric fins remain after the anisotropic etching process; and after performing the anisotropic etching process, replacing the dummy gate structure with a replacement gate structure. In an embodiment, replacing the dummy gate structure comprises: forming an interlayer dielectric (ILD) layer over the dielectric fins and around the dummy gate structure; removing a gate electrode of the dummy gate structure to form an opening between the gate spacers, wherein second portions of the layer stacks and second portions of the dielectric structures are disposed between the gate spacers under the opening; reducing a first height of a first dielectric structure of the dielectric structures while keeping a second height of a second dielectric structure of the dielectric structures unchanged; and after reducing the first height, selectively removing the first semiconductor material of the second portions of the layer stacks, wherein after the selectively removing, the second semiconductor material of the second portions of the layer stacks forms nanostructures, wherein the second dielectric structure extends further from the substrate than an upper surface of the nanostructures distal from the substrate. In an embodiment, the method further comprises, after selectively removing the first semiconductor material; fill the opening with an electrically conductive material; and recessing an upper surface of the electrically conductive material below an upper surface of the second dielectric structure distal from the substrate. In an embodiment, the method further comprises forming a gate dielectric material around the nanostructures before filling the opening. In an embodiment, the method further comprises selectively forming a tungsten layer on the electrically conductive material after the recessing. In an embodiment, the method further comprises, after selectively removing the first semiconductor material and before filling the opening, reducing first widths of first portions of the dielectric fins disposed between the gate spacers while keeping second widths of second portions of the dielectric fins disposed under the gate spacers unchanged. In an embodiment, the capping layer and the first semiconductor material comprise a same material. In an embodiment, the method further comprises forming source/drain regions over the semiconductor fins after performing the anisotropic etching process and before forming the ILD layer. In an embodiment, the method further comprises, after performing the anisotropic etching process and before forming the source/drain regions, replacing portions of the first semiconductor material disposed under the gate spacers with inner spacers, wherein the inner spacers are formed of a second dielectric material. In an embodiment, doping the ESL comprises performing an implantation process to implant the dopant in the ESL. In an embodiment, the first dielectric material is a metal oxide, wherein the ESL is formed of a second dielectric material, and the dopant of the ESL is B, As, Ge, C, Si, Ar, or Xe. In an embodiment, reducing the first height of the first dielectric structure comprises performing a plasma etching process using an etchant, wherein doping the ESL reduces an etch rate of the ESL for the etchant.

In accordance with an embodiment, a method of forming a semiconductor device includes: forming semiconductor fin structures protruding from between isolation regions formed on a substrate, wherein each of the semiconductor fin structures comprises a fin and a layer stack over the fin, wherein the layer stack comprises layers of a first semiconductor material interleaved with layers of a second semiconductor material; forming dielectric fins over the isolation regions in trenches between the semiconductor fin structures, wherein the semiconductor fin structures extend further from the substrate than the dielectric fins; forming dielectric structures over the dielectric fins, comprising: depositing an etch stop layer (ESL) in the trenches over the dielectric fins; implanting a dopant into the ESL; and forming a metal oxide in the trenches over the doped ESL; forming a dummy gate structure over the semiconductor fin structures and the dielectric structures; forming an interlayer dielectric layer (ILD) around the dummy gate structure; removing a dummy gate electrode of the dummy gate structure to form an opening in the ILD, wherein a first dielectric structure of the dielectric structures underlies the opening; performing a first etching process to reduce a first height of the first dielectric structure; and after performing the first etching process, selectively removing the first semiconductor material underlying the opening, wherein the second semiconductor material underlying the opening forms a plurality of channel regions of the semiconductor device. In an embodiment, the method further comprises: forming a gate dielectric material around the plurality of channel regions; and after forming the gate dielectric material, forming an electrically conductive material around the plurality of channel regions. In an embodiment, after performing the first etching process, the doped ESL underlying the metal oxide of the first dielectric structure remains over a respective dielectric fin. In an embodiment, the method further comprises, after removing the dummy gate electrode and before performing the first etching process: forming a patterned mask layer in the opening, wherein the patterned mask layer exposes the first dielectric structure, wherein performing the first etching process removes upper portions of the first dielectric structure. In an embodiment, the method further comprises, after performing the first etching process and before the selectively removing, performing a second etching process to remove the patterned mask layer and a dummy gate dielectric layer of the dummy gate structure. In an embodiment, the method further comprises, after forming the dummy gate structure and before forming the ILD: removing portions of the layer stack disposed beyond sidewalls of the dummy gate structure; and forming source/drain regions over the semiconductor fins on opposing sides of the dummy gate structure.

In accordance with an embodiment, a semiconductor device includes: a semiconductor fin protruding above a substrate; a first isolation region and a second isolation region on opposing sides of the semiconductor fin; nanostructures over and vertically aligned with the semiconductor fin; source/drain regions at opposing ends of the nanostructures; a dielectric fin on the first isolation region; a dielectric structure on the dielectric fin, wherein the dielectric structure comprises a metal oxide and an etch stop layer around sidewalls and a bottom surface of the metal oxide; and a gate electrode around the nanostructures. In an embodiment, the etch stop layer has an dopant, wherein a concentration of the dopant is lower than about 20 atomic percent (at %).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming semiconductor fin structures over a substrate, wherein each of the semiconductor fin structures comprises a layer stack over a semiconductor fin, wherein the layer stack comprises alternating layers of a first semiconductor material and a second semiconductor material;
   forming a capping layer over sidewalls and upper surfaces of the semiconductor fin structures;
   forming hybrid fins over isolation regions, wherein the isolation regions are on opposing sides of the semiconductor fin structures, wherein forming the hybrid fins comprises:
      forming dielectric fins over the isolation regions; and
      forming dielectric structures over the dielectric fins, comprising:
         forming an etch stop layer (ESL) over the dielectric fins;
         after forming the ESL, doping the ESL with a dopant; and forming a first dielectric material over the doped ESL;

forming a dummy gate structure over the semiconductor fin structures and over the hybrid fins;

forming gate spacers along sidewalls of the dummy gate structure;

performing an anisotropic etching process to remove first portions of the layer stacks and first portions of the dielectric structures that are disposed beyond exterior sidewalls of the gate spacers, wherein the dielectric fins remain after the anisotropic etching process; and after performing the anisotropic etching process, replacing the dummy gate structure with a replacement gate structure.

2. The method of claim 1, wherein replacing the dummy gate structure comprises:

forming an interlayer dielectric (ILD) layer over the dielectric fins and around the dummy gate structure;

removing a gate electrode of the dummy gate structure to form an opening between the gate spacers, wherein second portions of the layer stacks and second portions of the dielectric structures are disposed between the gate spacers under the opening;

reducing a first height of a first dielectric structure of the dielectric structures while keeping a second height of a second dielectric structure of the dielectric structures unchanged; and after reducing the first height, selectively removing the first semiconductor material of the second portions of the layer stacks, wherein after the selectively removing, the second semiconductor material of the second portions of the layer stacks forms nanostructures, wherein the second dielectric structure extends further from the substrate than an upper surface of the nanostructures distal from the substrate.

3. The method of claim 2, further comprising, after selectively removing the first semiconductor material:

filling the opening with an electrically conductive material; and recessing an upper surface of the electrically conductive material below an upper surface of the second dielectric structure distal from the substrate.

4. The method of claim 3, further comprising forming a gate dielectric material around the nanostructures before filling the opening.

5. The method of claim 3, further comprising selectively forming a tungsten layer on the electrically conductive material after the recessing.

6. The method of claim 3, further comprising, after selectively removing the first semiconductor material and before filling the opening, reducing first widths of first portions of the dielectric fins disposed between the gate spacers while keeping second widths of second portions of the dielectric fins disposed under the gate spacers unchanged.

7. The method of claim 2, wherein the capping layer and the first semiconductor material comprise a same material.

8. The method of claim 2, further comprising forming source/drain regions over the semiconductor fins after performing the anisotropic etching process and before forming the ILD layer.

9. The method of claim 8, further comprising, after performing the anisotropic etching process and before forming the source/drain regions, replacing portions of the first semiconductor material disposed under the gate spacers with inner spacers, wherein the inner spacers are formed of a second dielectric material.

10. The method of claim 1, wherein doping the ESL comprises performing an implantation process to implant the dopant in the ESL.

11. The method of claim 10, wherein the first dielectric material is a metal oxide, wherein the ESL is formed of a second dielectric material, and the dopant of the ESL is B, As, Ge, C, Si, Ar, or Xe.

12. The method of claim 2, wherein reducing the first height of the first dielectric structure comprises performing a plasma etching process using an etchant, wherein doping the ESL reduces an etch rate of the ESL for the etchant.

13. A method of forming a semiconductor device, the method comprising:

forming semiconductor fin structures protruding from between isolation regions formed on a substrate, wherein each of the semiconductor fin structures comprises a fin and a layer stack over the fin, wherein the layer stack comprises layers of a first semiconductor material interleaved with layers of a second semiconductor material;

forming dielectric fins over the isolation regions in trenches between the semiconductor fin structures, wherein the semiconductor fin structures extend further from the substrate than the dielectric fins;

forming dielectric structures over the dielectric fins, comprising:

depositing an etch stop layer (ESL) in the trenches over the dielectric fins;

implanting a dopant into the ESL; and forming a metal oxide in the trenches over the doped ESL;

forming a dummy gate structure over the semiconductor fin structures and the dielectric structures;

forming an interlayer dielectric layer (ILD) around the dummy gate structure;

removing a dummy gate electrode of the dummy gate structure to form an opening in the ILD, wherein a first dielectric structure of the dielectric structures underlies the opening;

performing a first etching process to reduce a first height of the first dielectric structure; and after performing the first etching process, selectively removing the first semiconductor material underlying the opening, wherein the second semiconductor material underlying the opening forms a plurality of channel regions of the semiconductor device.

14. The method of claim 13, further comprising:

forming a gate dielectric material around the plurality of channel regions; and after forming the gate dielectric material, forming an electrically conductive material around the plurality of channel regions.

15. The method of claim 13, wherein after performing the first etching process, the doped ESL underlying the metal oxide of the first dielectric structure remains over a respective dielectric fin.

16. The method of claim 13, wherein the method further comprises, after removing the dummy gate electrode and before performing the first etching process:

forming a patterned mask layer in the opening, wherein the patterned mask layer exposes the first dielectric structure, wherein performing the first etching process removes upper portions of the first dielectric structure.

17. The method of claim 16, further comprising, after performing the first etching process and before the selectively removing, performing a second etching process to remove the patterned mask layer and a dummy gate dielectric layer of the dummy gate structure.

18. The method of claim 13, further comprising, after forming the dummy gate structure and before forming the ILD:
- removing portions of the layer stack disposed beyond sidewalls of the dummy gate structure; and
- forming source/drain regions over the semiconductor fins on opposing sides of the dummy gate structure.

19. A semiconductor device comprising:
- a semiconductor fin protruding above a substrate;
- a first isolation region and a second isolation region on opposing sides of the semiconductor fin;
- nanostructures over and vertically aligned with the semiconductor fin;
- source/drain regions at opposing ends of the nanostructures;
- a first dielectric fin and a second dielectric fin on the first isolation region and the second isolation region, respectively;
- a first dielectric structure and a second dielectric structure on the first dielectric fin and the second dielectric fin, respectively, wherein each of the first dielectric structure and the second dielectric structure comprises a dielectric material and an etch stop layer around sidewalls and a bottom surface of the dielectric material; and
- a gate electrode around the nanostructures, wherein the gate electrode extends along a first portion of the first dielectric structure and a first portion of the second dielectric structure, wherein the first portion of the first dielectric structure extends further from the substrate than the first portion of the second dielectric structure.

20. The semiconductor device of claim 19, further comprising a gate spacer along a sidewall of the gate electrode, wherein the gate spacer extends along a second portion of the first dielectric structure and a second portion of the second dielectric structure, wherein an upper surface of the second portion of the first dielectric structure distal from the substrate is level with an upper surface of the second portion of the second dielectric structure.

* * * * *